United States Patent
Wada

(10) Patent No.: US 8,726,060 B2
(45) Date of Patent: May 13, 2014

(54) SEMICONDUCTOR INTEGRATED CIRCUIT FOR TRANSMITTING AND RECEIVING DATA SIGNALS IN A SOURCE-SYNCHRONOUS SCHEME

(75) Inventor: Tooru Wada, Osaka (JP)

(73) Assignee: Panasonic Corporation, Osaka (JP)

(*) Notice: Subject to any disclaimer, the term of this patent is extended or adjusted under 35 U.S.C. 154(b) by 206 days.

(21) Appl. No.: 13/342,452

(22) Filed: Jan. 3, 2012

(65) Prior Publication Data

US 2012/0098353 A1 Apr. 26, 2012

Related U.S. Application Data

(63) Continuation of application No. PCT/JP2010/000696, filed on Feb. 5, 2010.

(30) Foreign Application Priority Data

Aug. 18, 2009 (JP) .................................. 2009-189474

(51) Int. Cl.
| | | |
|---|---|---|
| *G06F 13/16* | (2006.01) | |
| *G06F 1/10* | (2006.01) | |
| *G06F 1/04* | (2006.01) | |
| *G06F 13/42* | (2006.01) | |

(52) U.S. Cl.
CPC .............. *G06F 13/1689* (2013.01); *G06F 1/10* (2013.01); *G06F 1/04* (2013.01); *G06F 13/4243* (2013.01)
USPC ........................................ 713/340; 713/500

(58) Field of Classification Search
CPC ........... G06F 1/04; G06F 1/10; G06F 13/161; G06F 13/1689; G06F 13/4243
USPC ................................. 713/500, 340
See application file for complete search history.

(56) References Cited

U.S. PATENT DOCUMENTS

| | | | | |
|---|---|---|---|---|
| 4,761,572 A | * | 8/1988 | Tanizawa ........................ | 327/310 |
| 6,493,407 B1 | * | 12/2002 | Sheafor et al. ................. | 375/356 |
| 6,996,785 B1 | * | 2/2006 | Kizhepat et al. .............. | 716/138 |
| 2002/0029362 A1 | * | 3/2002 | Stephen et al. ............... | 714/752 |
| 2003/0189973 A1 | * | 10/2003 | Doblar et al. .................. | 375/215 |
| 2004/0170240 A1 | * | 9/2004 | Radjassamy .................. | 375/354 |
| 2004/0212413 A1 | * | 10/2004 | Lee ................................ | 327/158 |

(Continued)

FOREIGN PATENT DOCUMENTS

| | | | | |
|---|---|---|---|---|
| JP | 2000-347993 | 12/2000 | | |
| JP | 2001-285312 | 10/2001 | | |
| JP | 02001285312 A | * 10/2001 | ............. | H04L 12/28 |
| WO | WO 2004/010315 A1 | 1/2004 | | |

OTHER PUBLICATIONS

International Search Report issued in International Patent Application No. PCT/JP2010/000696 dated Mar. 30, 2010.

(Continued)

*Primary Examiner* — Thomas Lee
*Assistant Examiner* — Danny Chan
(74) *Attorney, Agent, or Firm* — McDermott Will & Emery LLP

(57) ABSTRACT

An adjustment circuit including tri-state circuits is provided between a transmitter circuit and a receiver circuit. Jitter generated by transmission of a signal over a long-distance interconnect is reduced by being converted into jitter of control signals generated by a pulse generator circuit in the tri-state circuits.

10 Claims, 23 Drawing Sheets

(56) References Cited

U.S. PATENT DOCUMENTS

2005/0262289 A1 11/2005 Okuda et al.
2007/0200604 A1* 8/2007 Yun et al. ...................... 327/158
2008/0209303 A1* 8/2008 Leung et al. .................. 714/763
2009/0102581 A1* 4/2009 Drost et al. ................. 333/24 C
2009/0326843 A1* 12/2009 Song .............................. 702/65
2010/0194468 A1* 8/2010 Kumamaru ................... 327/535

OTHER PUBLICATIONS

B. Stackhouse et al., "A 65 nm 2-Billion Transistor Quad-Core Itanium Processor," IEEE Journal of Solid-State Circuits, vol. 44, No. 1, Jan. 2009.

* cited by examiner

SEMICONDUCTOR INTEGRATED CIRCUIT FOR TRANSMITTING AND RECEIVING DATA SIGNALS IN A SOURCE-SYNCHRONOUS SCHEME

CROSS-REFERENCE TO RELATED APPLICATIONS

This is a continuation of PCT International Application PCT/JP2010/000696 filed on Feb. 5, 2010, which claims priority to Japanese Patent Application No. 2009-189474 filed on Aug. 18, 2009. The disclosures of these applications including the specifications, the drawings, and the claims are hereby incorporated by reference in their entirety.

BACKGROUND

The present disclosure relates to semiconductor integrated circuits used in LSI employing microfabrication process technology, in which data signals are transferred at a high transfer rate from the core of a sender to the core of a receiver.

Conventionally, in an LSI circuit, when a data signal is transferred from the core (circuit) of a sender to the core (circuit) of a receiver, a clock is supplied from the same source point to both of the sender's core and the receiver's core so that flip-flops (hereinafter referred to as "FFs") in the sender's core and the receiver's core operate in synchronization with each other. In such an operation scheme, if the operation is performed at a clock frequency of as high as several gigahertz or higher, a data signal cannot be correctly transferred unless the total of a delay time in the FF of the sender's core, a delay time in an interconnect between the cores, and a setup time in the FF of the receiver's core is smaller than or equal to the period of one cycle of the clock.

In an effort to address this problem, a semiconductor integrated circuit has been described in which data and a source clock are simultaneously transferred from the sender's LSI in the same transmission path, and in the receiver's LSI, the data is sampled using the source clock and then synchronized with the clock of the receiver's LSI, whereby variations in the delay time of the transmission path and clock skew are reduced (see Japanese Patent Publication No. 2000-347993 (hereinafter referred to as Patent Document 1)).

However, in the conventional technique described in Patent Document 1, when data signals are transferred at high speed in the microfabrication process, it is difficult to ensure an eye pattern. For example, as the microfabrication process has been advanced, the gate lengths of transistors have been reduced, so that the lengths of interconnects for signals in blocks have also been reduced. Therefore, a fine layer used in the interconnect in the block can maintain the performance thereof even if the sheet resistance and coupling capacitance of the fine layer are high. On the other hand, the total number of hard macros and processors mounted in an LSI circuit increases, and therefore, the chip area of the LSI circuit is almost constant. As a result, the interconnect length of the transmission path is constant, and therefore, the values of a parasitic resistance and capacitance increase, so that the eye pattern becomes smaller due to the fluctuation (jitter) of data.

In an effort to address the problem with Patent Document 1, a semiconductor integrated circuit has been described in which a double edge triggered latch is used to re-adjust the skew (jitter) of data occurring when the data is transferred over a long-distance interconnect (see Blaine Stackhouse, et al., "A 65 nm 2-Billion Transistor Quad-Core Itanium Processor," IEEE JOURNAL OF SOLID-STATE CIRCUITS, VOL. 44, NO. 1, pp. 18-31, JANUARY 2009 (hereinafter referred to as a Non-Patent Document 1)).

FIG. 21 shows an example double edge triggered latch. The double edge triggered latch is a circuit which, when a change (rise and fall of a waveform) occurs in the voltage level of a trigger signal CK, latches the value of a data signal D and propagates the value of the data signal D to an output Q. Note that, in FIG. 21, a reference character CKN indicates an inverted trigger signal obtained by inverting the trigger signal CK, and a reference character CKP indicates a non-inverted trigger signal obtained by inverting the inverted trigger signal CKN.

On the other hand, in the level triggered latch shown in FIG. 22, when the potential level of the trigger signal CK is at the high level, the value of the data signal D is propagated to the output Q, and when the potential level of the trigger signal CK is at the low level, the value of the output Q is maintained. Note that, in FIG. 22, a reference character CKB indicates an inverted trigger signal obtained by inverting the trigger signal CK.

The double edge triggered latch shown in FIG. 21 is different from the level triggered latch shown in FIG. 22, in that two master latches which capture data at the rise and fall of the waveform, and a slave latch which switches the master latches, i.e., selects one of them as a transfer target, at the rise and fall of the waveform, are required. Therefore, at least three stages of transistors are required in a path in which a data signal is transferred, resulting in a complicated circuit.

In other words, in the conventional technique described in Non-Patent Document 1, there is a high latency in a data signal in a long-distance interconnect which requires a plurality of double edge triggered latches for re-adjusting data skew. Also, because a single clock signal is used as a trigger signal to operate the double edge triggered latches, the power consumption increases and the level of noise becomes higher.

SUMMARY

The present disclosure describes implementations of a technique of providing a high transfer rate and a low latency of high-speed transmission in a chip even in the microfabrication process.

According to the present disclosure, the following examples are provided.

A first example semiconductor integrated circuit for transmitting and receiving a plurality of data signals in a source-synchronous scheme using an internal bus, includes a transmitter circuit configured to transmit a clock signal along with the plurality of data signals, a receiver circuit configured to receive the plurality of data signals and the clock signal, and at least one adjustment circuit configured to relay the plurality of data signals and the clock signal from the transmitter circuit to the receiver circuit. The adjustment circuit includes a pulse generator circuit configured to generate a pulsed control signal based on the clock signal transmitted from the transmitter circuit or the adjustment circuit in a preceding stage, and a plurality of tri-state circuits configured to receive the plurality of data signals transmitted from the transmitter circuit or the adjustment circuit in the preceding stage, and be switched based on the control signal to output the plurality of data signals to the receiver circuit or the adjustment circuit in a succeeding stage.

As a result, jitter generated by transmission of a signal over a long-distance interconnect is reduced by being converted into jitter of a control signal generated by the pulse generator circuit in the tri-state circuits. Therefore, a high transfer rate and a low latency can be obtained even in the microfabrication process.

A second example semiconductor integrated circuit for transmitting and receiving a plurality of data signals in a source-synchronous scheme using an internal bus, includes a transmitter circuit configured to transmit a clock signal along with the plurality of data signals, a receiver circuit configured to receive the plurality of data signals and the clock signal, a control circuit configured to generate a pulse width adjustment signal, and at least one adjustment circuit configured to relay the plurality of data signals and the clock signal from the transmitter circuit to the receiver circuit. The adjustment circuit includes a pulse generator circuit configured to generate a pulsed control signal based on the clock signal transmitted from the transmitter circuit or the adjustment circuit in a preceding stage, and the pulse width adjustment signal, and a plurality of tri-state circuits configured to receive the plurality of data signals transmitted from the transmitter circuit or the adjustment circuit in the preceding stage, and be switched based on the control signal to output the plurality of data signals to the receiver circuit or the adjustment circuit in a succeeding stage.

As a result, jitter generated by transmission of a signal over a long-distance interconnect is reduced by being converted into jitter of a control signal generated by the pulse generator circuit in the tri-state circuits. Moreover, the pulse width of the control signal generated by the pulse generator circuit can be adjusted. Therefore, a high transfer rate and a low latency can be obtained even in the microfabrication process.

The second example semiconductor integrated circuit may further include a temperature detection circuit configured to detect a change in temperature and adjust the control circuit, depending on an amount of the temperature change.

As a result, the pulse width of the control signal generated by the pulse generator circuit can be controlled to an optimum pulse width, depending on a change in temperature, during operation.

The second example semiconductor integrated circuit may further include a voltage detection circuit configured to detect a change in voltage and adjust the control circuit, depending on an amount of the voltage change.

As a result, the pulse width of the control signal generated by the pulse generator circuit can be controlled to an optimum pulse width, depending on a change in voltage, during operation.

The second example semiconductor integrated circuit may further include a monitor circuit configured to detect a change in current amount and adjust the control circuit so that the current amount becomes constant.

As a result, the pulse width of the control signal generated by the pulse generator circuit can be controlled to an optimum pulse width by monitoring the current amount during operation.

The second example semiconductor integrated circuit may further include a replica circuit configured to detect a change in delay time and adjust the control circuit so that the delay time becomes constant.

As a result, the pulse width of the control signal generated by the pulse generator circuit can be controlled to an optimum pulse width, depending on a change in delay time in the replica circuit, during operation.

A third example semiconductor integrated circuit for transmitting and receiving a plurality of data signals in a source-synchronous scheme using an internal bus, includes a memory interface block, at least one read data adjustment circuit, at least one functional block, and at least one write data adjustment circuit. Read data is transmitted from the memory interface block to the read data adjustment circuit serially connected thereto, and is transferred from each of the read data adjustment circuits to the corresponding functional block. Write data is transferred from the plurality of functional blocks to the write data adjustment circuit, and is transmitted from the write data adjustment circuit serially connected thereto to the memory interface block.

With this configuration, a signal interconnect in a chip can be optimized to provide a high transfer rate and a low latency.

In the third example semiconductor integrated circuit, the read data adjustment circuit and the write data adjustment circuit may each include a pulse generator circuit configured to generate a pulsed control signal based on the clock signal transmitted from the memory interface block, the functional block, or the adjustment circuit in a preceding stage, and a plurality of tri-state circuits configured to receive the plurality of data signals transmitted from the memory interface block, the functional block, or the adjustment circuit in the preceding stage, and be switched based on the control signal to output the plurality of data signals to the memory interface block, the functional block, or the adjustment circuit in a succeeding stage.

As a result, jitter generated by transmission of a signal over a long-distance interconnect is reduced by being converted into jitter of a control signal generated by the pulse generator circuit in the tri-state circuits. Therefore, a high transfer rate and a low latency can be obtained even in the microfabrication process.

In the third example semiconductor integrated circuit, the read data adjustment circuit and the write data adjustment circuit may each include a pulse generator circuit configured to generate a pulsed control signal based on the clock signal transmitted from the memory interface block, the functional block, or the adjustment circuit in a preceding stage, and a pulse width adjustment signal, and a plurality of tri-state circuits configured to receive the plurality of data signals transmitted from the memory interface block, the functional block, or the adjustment circuit in the preceding stage, and be switched based on the control signal to output the plurality of data signals to the memory interface block, the functional block, or the adjustment circuit in a succeeding stage.

As a result, jitter generated by transmission of a signal over a long-distance interconnect is reduced by being converted into jitter of a control signal generated by the pulse generator circuit in the tri-state circuits. Moreover, the pulse width of the control signal generated by the pulse generator circuit can be adjusted. Therefore, a high transfer rate and a low latency can be obtained even in the microfabrication process.

In the third example semiconductor integrated circuit, the read data adjustment circuit and the write data adjustment circuit may be provided in or adjacent to the functional block.

With this configuration, a signal interconnect in a chip can be further optimized to provide a high transfer rate and a low latency.

As described above, according to the present disclosure, jitter generated by transmission of a signal over a long-distance interconnect is reduced by being converted into jitter of a control signal generated by the pulse generator circuit in the tri-state circuits. Therefore, a high transfer rate and a low latency can be obtained even in the microfabrication process.

DETAILED DESCRIPTION

Embodiments of a semiconductor integrated circuit according to the present disclosure will be described in detail hereinafter with reference to the accompanying drawings.

First Embodiment

Figure 1:
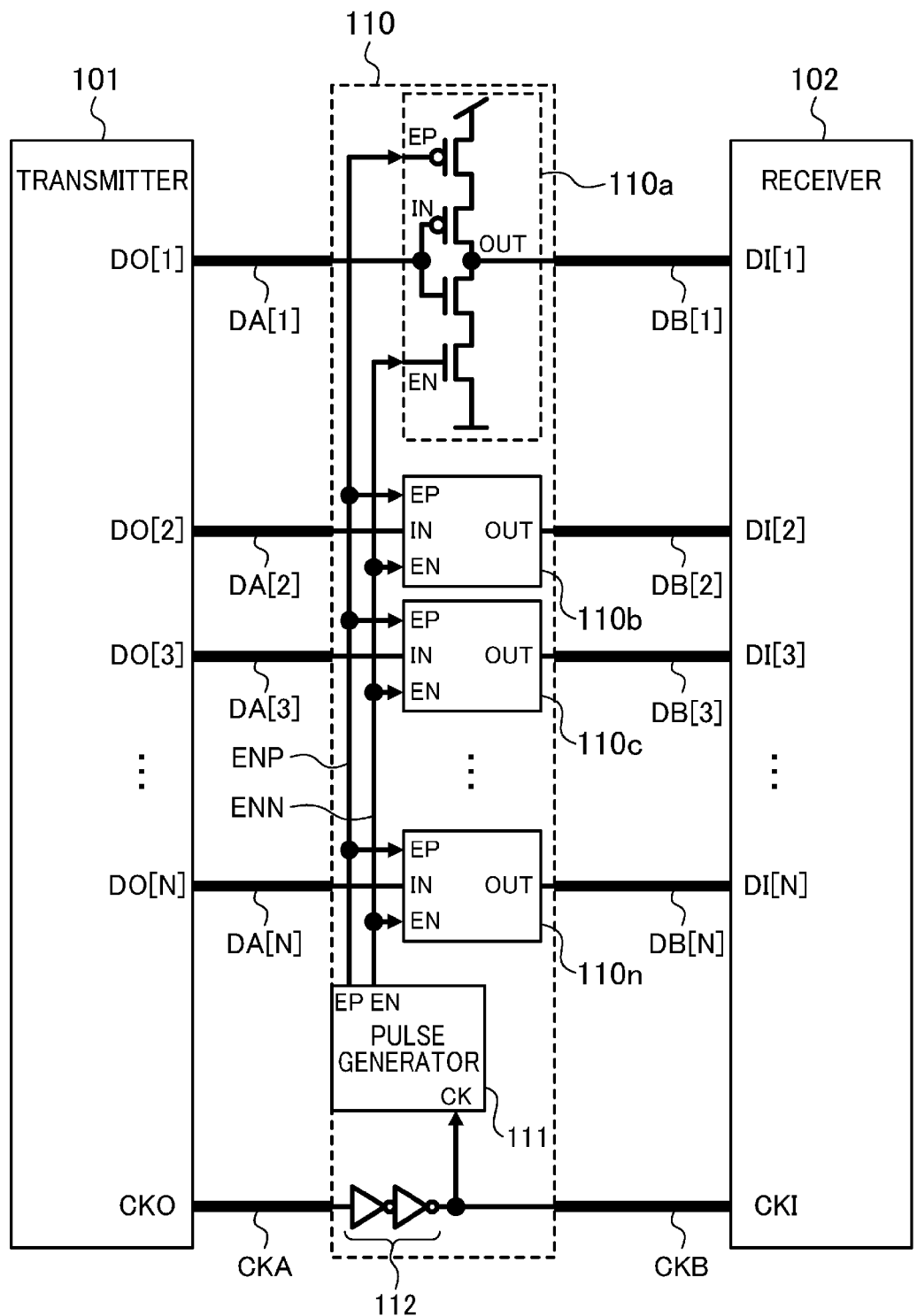
FIG. 1 is a block diagram showing a semiconductor integrated circuit according to a first embodiment of the present disclosure.

As shown in FIG. 1, a semiconductor integrated circuit according to a first embodiment includes a transmitter circuit 101, a receiver circuit 102, an adjustment circuit 110, data signals DA[1], DA[2], DA[3], . . . , and DA[N], data signals DB[1], DB[2], DB[3], . . . , and DB[N], a clock signal CKA, and a clock signal CKB (N is a natural number of one or more). Note that any number of data signals and any number of clock signals may be used.

The data signals DA[1], DA[2], DA[3], . . . , and DA[N] and the clock signal CKA are physically arranged side by side to achieve a source-synchronous configuration. Also, the data signals DA[1], DA[2], DA[3], . . . , and DA[N] and the clock signal CKA are transferred over a long distance on the order of millimeters in a chip without a repeater, and therefore, have a low resistance in order to reduce a loss. Therefore, the data signals DA[1], DA[2], DA[3], . . . , and DA[N] and the clock signal CKA are transmitted through upper interconnects in the chip which are typically used to connect blocks together. This holds true for the data signals DB[1], DB[2], DB[3], . . . , and DB[N] and the clock signal CKB.

The transmitter circuit 101 transmits data to the data signals DA[1], DA[2], DA[3], . . . , and DA[N] via data signal outputs DO[1], DO[2], DO[3], . . . , and DO[N] (N is a natural number of one or more), and transmits a clock to the clock signal CKA via a clock signal output CKO.

The adjustment circuit 110 includes tri-state circuits 110a, 110b, 110c, . . . , and 110n, a pulse generator circuit 111, and an inverter circuit 112. The adjustment circuit 110 receives the data signals DA[1], DA[2], DA[3], . . . , and DA[N] and the clock signal CKA, and outputs the data signals DB[1], DB[2], DB[3], . . . , and DB[N] and the clock signal CKB. The inverter circuit 112 receives the clock signal CKA, and outputs the clock signal CKB. The pulse generator circuit 111 receives the output signal of the inverter circuit 112, and outputs control signals ENP and ENN. The tri-state circuits 110a, 110b, 110c, . . . , and 110n receive the data signals DA[1], DA[2], DA[3], . . . , and DA[N], respectively, and each receive the common control signals ENP and ENN, and output the data signals DB[1], DB[2], DB[3], . . . , and DB[N], respectively.

The receiver circuit 102 receives the data signals DB[1], DB[2], DB[3], . . . , and DB[N] at input terminals DI[1], DI[2], DI[3], . . . , and DI[N] (N is a natural number of one or more), respectively, and the clock signal CKB at an input terminal CKI.

Figure 2:
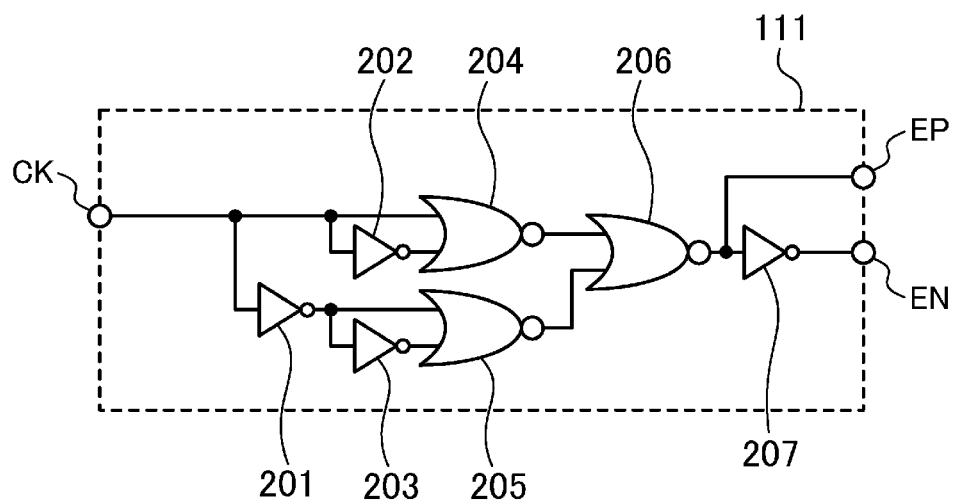
FIG. 2 is a circuit diagram showing a pulse generator circuit according to the first embodiment of the present disclosure.

FIG. 2 shows an example of the pulse generator circuit 111. An input signal CK is input to inverters 201 and 202 and a NOR circuit 204. The output of the inverter 201 is input to an inverter 203 and a NOR circuit 205. The output of the inverter 202 is input to the other input of the NOR circuit 204. The output of the inverter 203 is input to the other input of the NOR circuit 205. The output of the NOR circuit 204 is input to a NOR circuit 206. The output of the NOR circuit 205 is input to the other input of the NOR circuit 206. The output of the NOR circuit 206 is an output EP and is also input to an inverter 207. The output of the inverter 207 is an output EN.

Figure 3:
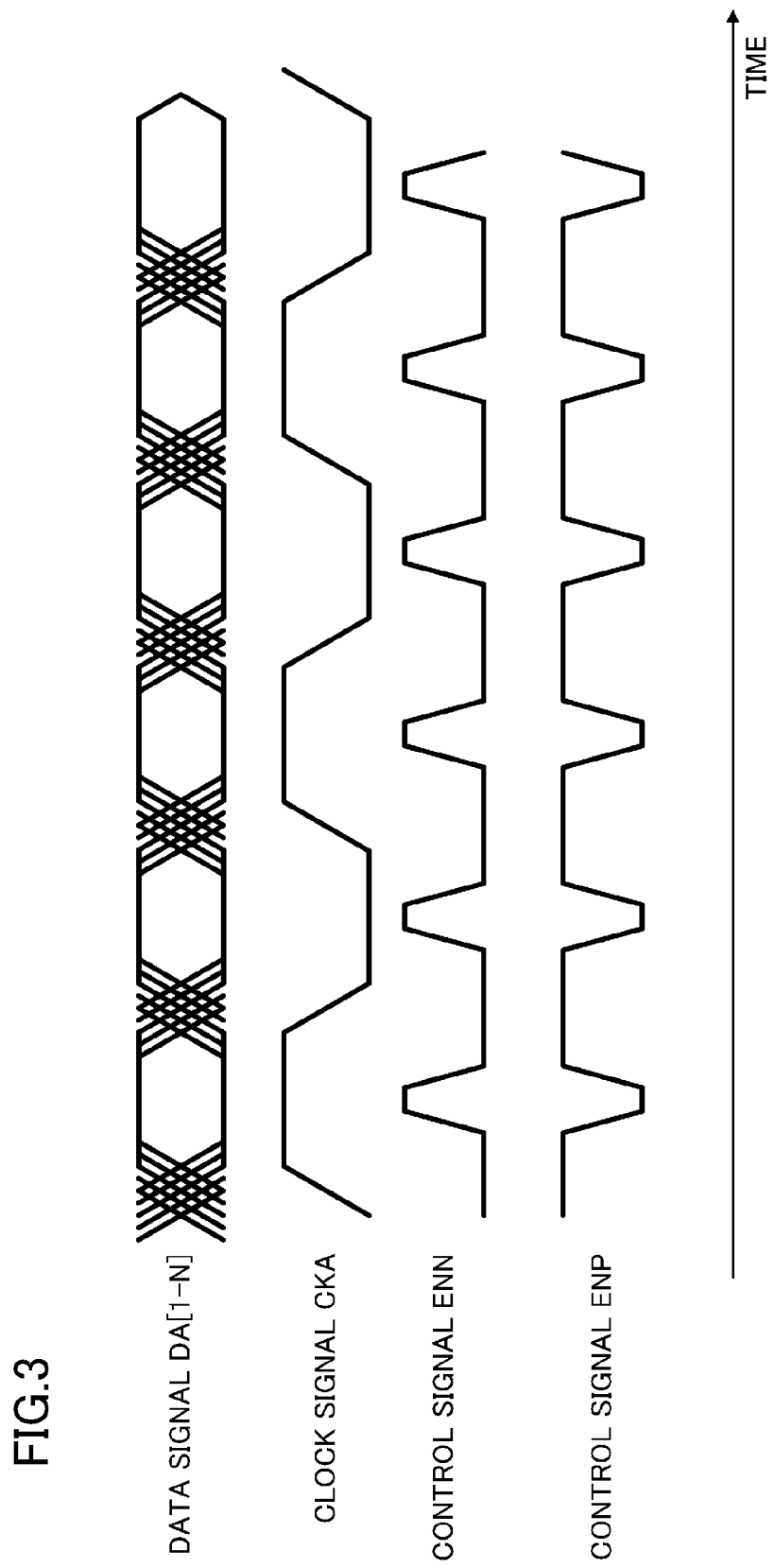
FIG. 3 is a waveform diagram showing operation of the semiconductor integrated circuit of the first embodiment of the present disclosure.

FIG. 3 shows a waveform diagram in the adjustment circuit 110. The waveforms of the data signals DA[1-N] are superimposed together at the inputs of the tri-state circuits 110a, 110b, 110c, ..., and 110n. As can be seen from FIG. 3, it takes a certain period of time (jitter) for data to settle at a data transition point. This occurs due to a change in data delay caused by inter-symbol interference (ISI) or crosstalk of data, a voltage change in the transmitter circuit 101, random variations in interconnect impedance, random variations of transistors in the transmitter circuit 101, etc.

Although a clock signal waveform typically has a rising edge at a data transition point, the clock signal CKA is transferred at the same rate as that of the data signals DA [1-N] in FIG. 3. By transferring data and a clock at the same transfer rate, it is possible to prevent the clock from becoming a bottleneck for the maximum transfer rate which is determined by the characteristic impedance of the interconnect.

The circuit configuration of FIG. 2 generates low pulses of the control signal ENP and high pulses of the control signal ENN, corresponding to rising edges and falling edges of the clock signal CKA as shown in FIG. 3.

With the above configuration, the jitter generated by transmission of the signal over the long-distance interconnect is reduced by being converted into the jitter of the control signals ENP and ENN generated by the pulse generator circuit 111 in the tri-state circuits 110a-110n. Therefore, even in the microfabrication process, a high transfer rate and a low latency can be provided.

Note that, in this embodiment, an example in which the single adjustment circuit 110 is used has been described. Even if a plurality of adjustment circuits are used because of a certain interconnect length required for data transfer, it is obvious that similar advantages are obtained. Although the adjustment circuit 110 includes, by way of example, one stage of tri-state circuits, the circuit may include inverters in a stage succeeding the tri-state circuits 110a-110n. Note that, in FIG. 1, the tri-state circuits 110a-110n are each a tri-state inverter, and therefore, the logic of each of the tri-state circuits 110a-110n needs to be inverted in the receiver circuit 102.

Figure 23B:
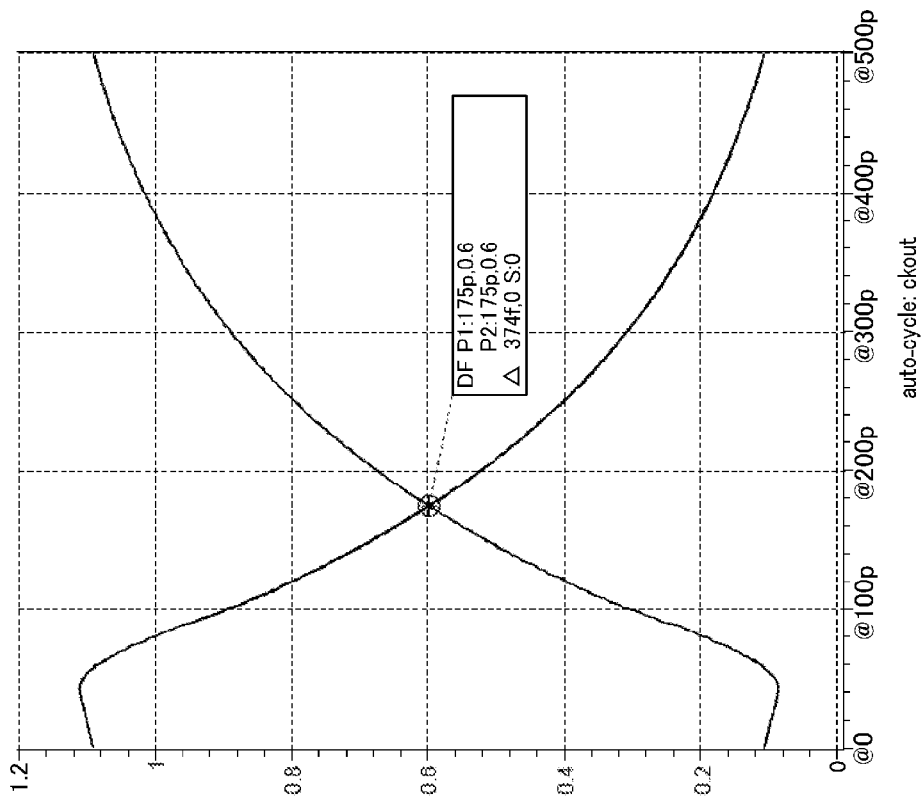
FIGS. 23A and 23B are diagrams showing results of a simulation of jitter of a data signal and a clock signal in the first embodiment of the present disclosure.
Figure 23A:
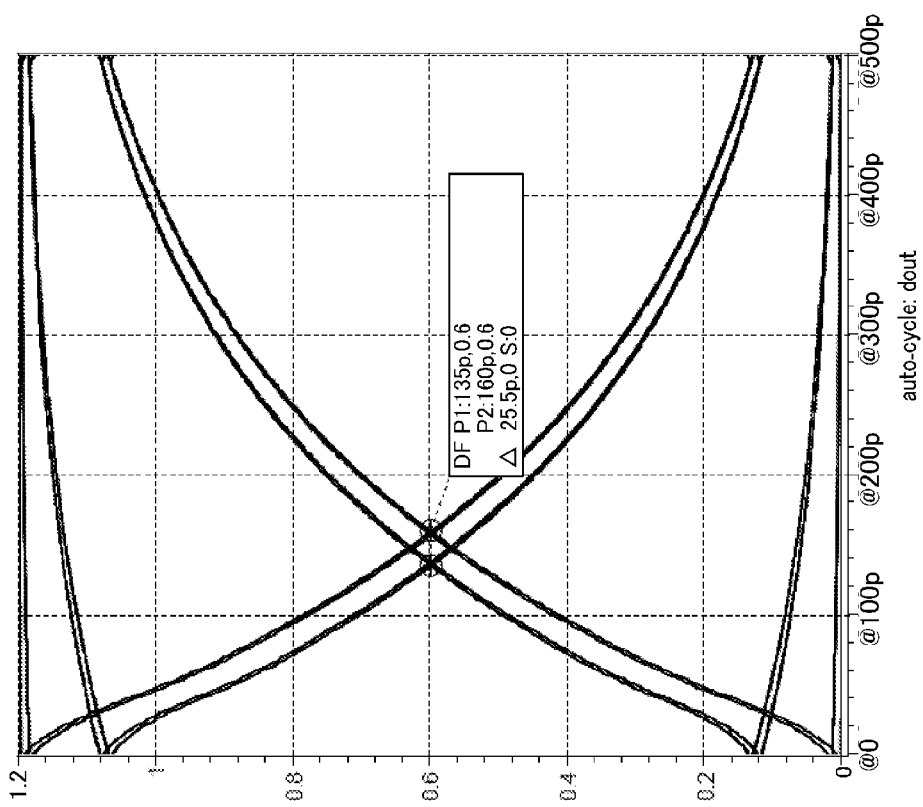

FIGS. 23A and 23B show results of a simulation of the jitter of the data signal and the clock signal. In this simulation, the transfer rate was set to 2 Gbps, the length of the long-distance interconnect was set to 3 mm, the power supply voltage was set to 1.2 V, the output impedance was set to 250Ω, and the parameters of a W element are set as follows.

Lo=4e−07, Co=2e−10, Ro=5e+04, Go=0, Rs=0.1, Gd=1e−10

As shown in FIG. 23A, the jitter of the data signal is 25.5 ps. As shown in FIG. 23B, the jitter of the clock signal is 0.4 ps. The jitter of the control signal is determined based on the jitter of the clock signal. Therefore, in this embodiment, the jitter of the data signal is converted from 25.5 ps into 0.4 ps, i.e., is reduced by 21.1 ps.

Second Embodiment

Figure 4:
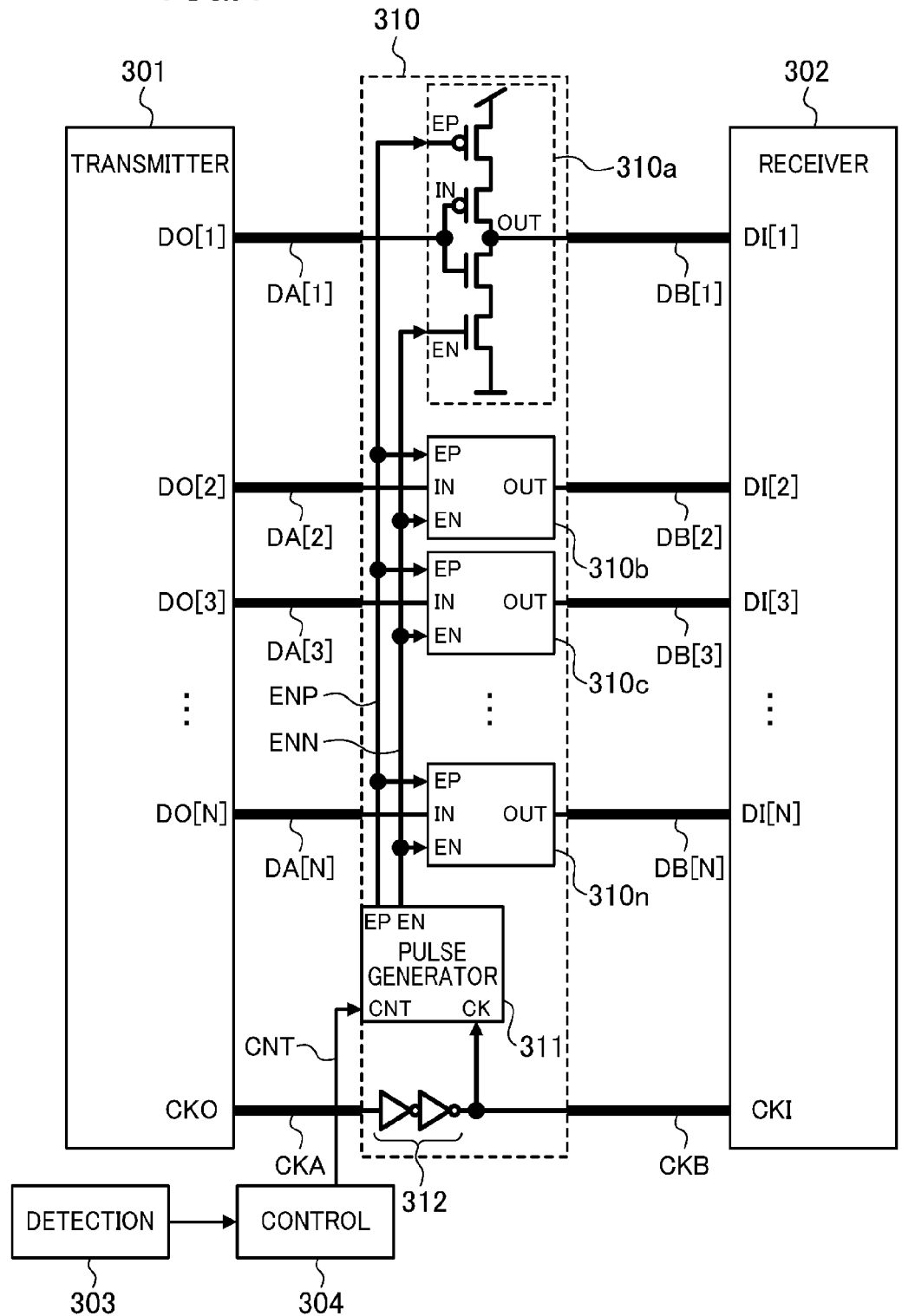
FIG. 4 is a block diagram showing a semiconductor integrated circuit according to a second embodiment of the present disclosure.

As shown in FIG. 4, a semiconductor integrated circuit according to a second embodiment includes a transmitter circuit 301, a receiver circuit 302, an adjustment circuit 310, a detection circuit 303, a control circuit 304, data signals DA[1], DA[2], DA[3], ..., and DA[N], data signals DB[1], DB[2], DB[3], ..., and DB[N], a clock signal CKA, and a clock signal CKB (N is a natural number of one or more). Note that any number of data signals and any number of clock signals may be used.

The data signals DA[1], DA[2], DA[3], ..., and DA[N] and the clock signal CKA are physically arranged side by side to achieve a source-synchronous configuration. Also, the data signals DA[1], DA[2], DA[3], ..., and DA[N] and the clock signal CKA are transferred over a long distance on the order of millimeters in a chip without a repeater, and therefore, have a low resistance in order to reduce a loss. Therefore, the data signals DA[1], DA[2], DA[3], ..., and DA[N] and the clock signal CKA are transmitted through upper interconnects in the chip which are typically used to connect blocks together. This holds true for the data signals DB[1], DB[2], DB[3], ..., and DB[N] and the clock signal CKB.

The transmitter circuit 301 transmits data to the data signals DA[1], DA[2], DA[3], ..., and DA[N] via data signal outputs DO[1], DO[2], DO[3], ..., and DO[N] (N is a natural number of one or more), and transmits a clock to the clock signal CKA via a clock signal output CKO.

The adjustment circuit 310 includes tri-state circuits 310a, 310b, 310c, ..., and 310n, a pulse generator circuit 311, and an inverter circuit 312. The adjustment circuit 310 receives the data signals DA[1], DA[2], DA[3], ..., and DA[N] and the clock signal CKA, and outputs the data signals DB[1], DB[2], DB[3], ..., and DB[N] and the clock signal CKB. The inverter circuit 312 receives the clock signal CKA, and outputs the clock signal CKB. The pulse generator circuit 311 receives the output signal of the inverter circuit 312, and outputs control signals ENP and ENN.

The detection circuit 303 detects changes in the internal temperature of the chip, the power supply voltage, the current amount of a monitor circuit, the delay time of a replica circuit, etc. The control circuit 304 receives a signal detected by the detection circuit 303, and outputs a pulse width adjustment signal CNT to the pulse generator circuit 311.

The tri-state circuits 310a, 310b, 310c, ..., and 310n receive the data signals DA[1], DA[2], DA[3], ..., and DA[N], respectively, and each receive the common control signals ENP and ENN, and output the data signals DB[1], DB[2], DB[3], ..., and DB[N], respectively.

The receiver circuit 302 receives the data signals DB[1], DB[2], DB[3], ..., and DB[N] at input terminals DI[1], DI[2], DI[3], ..., and DI[N] (N is a natural number of one or more), respectively, and the clock signal CKB at an input terminal CKI.

Figure 5:
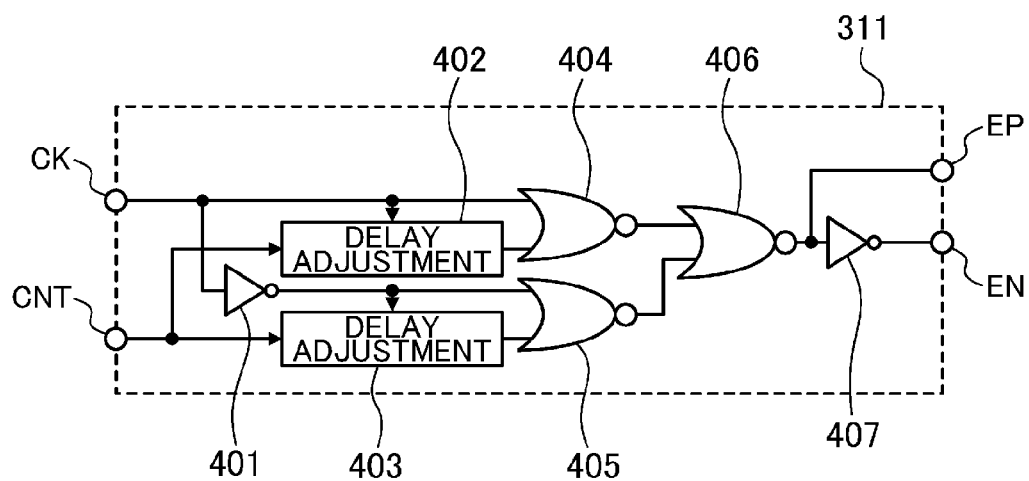
FIG. 5 is a circuit diagram showing a pulse generator circuit according to the second embodiment of the present disclosure.

FIG. 5 shows an example of the pulse generator circuit 311. An input signal CK is input to an inverter 401, a delay adjustment circuit 402, and a NOR circuit 404. The output of the inverter 401 is input to a delay adjustment circuit 403 and a NOR circuit 405. The delay adjustment circuits 402 and 403 change a delay time which it takes to transmit an input signal to an output signal, based on the pulse width adjustment signal CNT. For example, the delay adjustment circuits 402 and 403 adjust the delay by changing the power supply voltage or the substrate voltage based on the pulse width adjustment signal CNT.

The output of the delay adjustment circuit 402 is input to the other input of the NOR circuit 404. The output of the delay adjustment circuit 403 is input to the other input of the NOR circuit 405. The output of the NOR circuit 404 is input to a NOR circuit 406. The output of the NOR circuit 405 is input to the other input of the NOR circuit 406. The output of the NOR circuit 406 is an output EP and is input to an inverter 407. The output of the inverter 407 is an output EN.

The pulse width needs to be long enough to ensure a time required to switch the tri-state circuits 310a-310n. If the pulse width is excessively broadened, the jitter portion is passed through the tri-state circuits 310a-310n, so that the jitter cannot be reduced. In other words, the transfer rate cannot be increased.

The circuit configuration of FIG. 5 generates low pulses of the control signal ENP and high pulses of the control signal ENN, corresponding to rising edges and falling edges of the clock signal. Moreover, the pulse width can be adjusted based on the pulse width adjustment signal CNT.

With the above configuration, the jitter generated by transmission of the signal over the long-distance interconnect is reduced by being converted into the jitter of the control signals ENP and ENN generated by the pulse generator circuit 311 in the tri-state circuits 310a-310n. Therefore, even in the microfabrication process, a high transfer rate and a low latency can be provided.

Note that, in this embodiment, an example in which the single adjustment circuit 310 is used has been described. Even if a plurality of adjustment circuits are used because of a certain interconnect length required for data transfer, it is obvious that similar advantages are obtained. Although the adjustment circuit 310 includes, by way of example, one stage of tri-state circuits, the circuit may include inverters in a stage succeeding the tri-state circuits 310a-310n. Note that, in FIG. 4, the tri-state circuits 310a-310n are each a tri-state inverter, and therefore, the logic of each of the tri-state circuits 310a-310n needs to be inverted in the receiver circuit 302.

Third Embodiment

Figure 6:
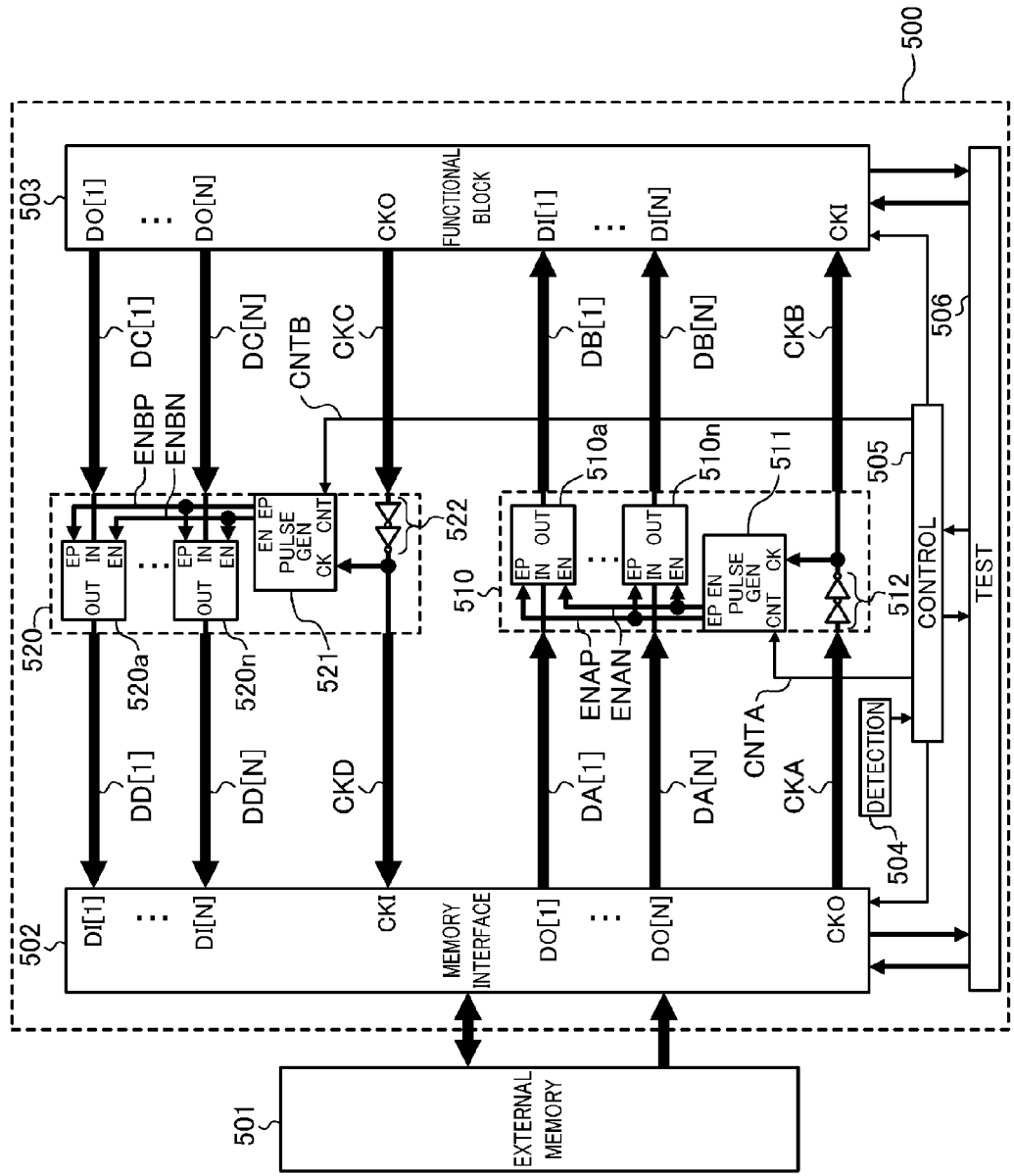
FIG. 6 is a block diagram showing a semiconductor integrated circuit according to a third embodiment of the present disclosure.

As shown in FIG. 6, a semiconductor integrated circuit 500 according to a third embodiment includes a memory interface block 502, a functional block 503, an adjustment circuits 510 and 520, a detection circuit 504, a control circuit 505, a test circuit 506, data signals DA[1], DA[2], DA[3], ..., and DA[N], data signals DB[1], DB[2], DB[3], ..., and DB[N], data signals DC[1], DC[2], DC[3], ..., and DC[N], data signals DD[1], DD[2], DD[3], ..., and DD[N], a clock signal CKA, a clock signal CKB, a clock signal CKC, and a clock signal CKD (N is a natural number of one or more). The semiconductor integrated circuit 500 receives and outputs data signals and control signals (e.g., addresses etc.) from and to an external memory 501. Note that any number of data signals and any number of clock signals may be used.

The memory interface block 502 transmits read data of the external memory 501 to the data signals DA[1], ..., and DA[N] via data signal outputs DO[1], ..., and DO[N], and transmits a clock to the clock signal CKA via a clock signal output CKO.

The adjustment circuit 510 includes tri-state circuits 510a, ..., and 510n, a pulse generator circuit 511, and an inverter circuit 512. The adjustment circuit 510 receives the data signals DA[1], ..., and DA[N] and the clock signal CKA, and outputs the data signals DB[1], ..., and DB[N] and the clock signal CKB. The inverter circuit 512 receives the clock signal CKA, and outputs the clock signal CKB. The pulse generator circuit 511 receives the output signal of the inverter circuit 512, and outputs control signals ENAP and ENAN.

The detection circuit 504 detects changes in the internal temperature of the chip, the power supply voltage, the current amount of a monitor circuit, the delay time of a replica circuit, etc. The control circuit 505 receives a signal detected by the detection circuit 504, and outputs a pulse width adjustment signal CNTA to the pulse generator circuit 511. The control circuit 505 also outputs a test sequence signal to the memory interface block 502 and the functional block 503.

The tri-state circuits 510a, ..., and 510n receive the data signals DA[1], ..., and DA[N], respectively, and each receive the common control signals ENAP and ENAN, and output the data signals DB[1], ..., and DB[N], respectively.

The functional block 503 receives the data signals DB[1], ..., and DB[N] at input terminals DI[1], ..., and DI[N], respectively, and the clock signal CKB at an input terminal CM, and transmits write data to data signals DC[1], ..., and DC[N] via the data outputs DO[1], ..., and DO[N], and a clock to the clock signal CKC via the clock signal output CKO.

The adjustment circuit 520 includes tri-state circuits 520a, ..., and 520n, a pulse generator circuit 521, and an inverter circuit 522. The adjustment circuit 520 receives the data signal DC[1], ..., and DC[N] and the clock signal CKC, and outputs data signals DD[1], ..., and DD[N] and the clock signal CKD. The inverter circuit 522 receives the clock signal CKC, and outputs and transmits the clock signal CKD to the input terminal CKI of the memory interface block 502. The pulse generator circuit 521 receives the output signal of the inverter circuit 522, and outputs control signals ENBP and ENBN.

The tri-state circuits 520a, ..., and 520n receive the data signals DC[1], ..., and DC[N], respectively, each receive the common control signals ENBP and ENBN, and output and transmit the data signals DD[1], ..., and DD[N] to the input terminals DI[1], ..., and DI[N] of the memory interface block 502, respectively.

The control circuit 505 receives a signal detected by the detection circuit 504, and outputs a pulse width adjustment signal CNTB to the pulse generator circuit 521.

The test circuit 506 receives the control signal of the control circuit 505, outputs a test signal to the memory interface block 502, and receives a test signal from the functional block 503. The test circuit 506 also compares the output test signal with the received test signal, and inputs the comparison result to the control circuit 505.

Next, a method for determining the pulse width using the test circuit 506 will be described. Initially, if the external memory 501 is DRAM, then when it is during a DRAM refresh period, or the change in the internal temperature of the chip, the power supply voltage, the current amount of the monitor circuit, the delay time of the replica circuit, etc. detected by the detection circuit 504 is larger than or equal to a predetermined value, the control circuit 505 switches a test sequence signal on. Moreover, a method of testing write data while read data is being read from the external memory 501, and testing read data while write data is being written to the external memory 501, may be used.

When the test sequence signal for read data is switched on, test data is transferred from the test circuit 506 via the memory interface block 502, the adjustment circuit 510, and the functional block 503 to the test circuit 506. The test circuit 506 compares the output test data with the received test data to set a pulse width adjustment signal CNTA for the control circuit 505. The pulse width adjustment signal CNTA is used to adjust the pulse width of the pulse generator circuit 511 and the delay time of the pulse rising edge.

When the test sequence signal for write data is switched on, test data is transmitted from the test circuit 506 via the functional block 503, the adjustment circuit 520, and the memory interface block 502 to the test circuit 506. The test circuit 506 compares the output test data with the received test data to set a pulse width adjustment signal CNTB for the control circuit 505. The pulse width adjustment signal CNTB is used to adjust the pulse width of the pulse generator circuit 521 and the delay time of the pulse rising edge.

With the above method, the jitter generated by transmission of the signal over the long-distance interconnect in the semiconductor integrated circuit 500 is reduced by being converted into the jitter of the control signals generated by the pulse generator circuits 511 and 521 in the tri-state circuits 510a-510n and 520a-520n. Therefore, even in the microfabrication process, a high transfer rate and a low latency can be provided.

Note that, in FIG. 6, the tri-state circuits 510a-510n and 520a-520n are each a tri-state inverter, and therefore, when read data is received by the functional block 503, the logic of each of the tri-state circuits 510a-510n needs to be inverted, and when write data is output by the functional block 503, the logic of each of the tri-state circuits 520a-520n needs to be inverted.

Fourth Embodiment

Figure 7:
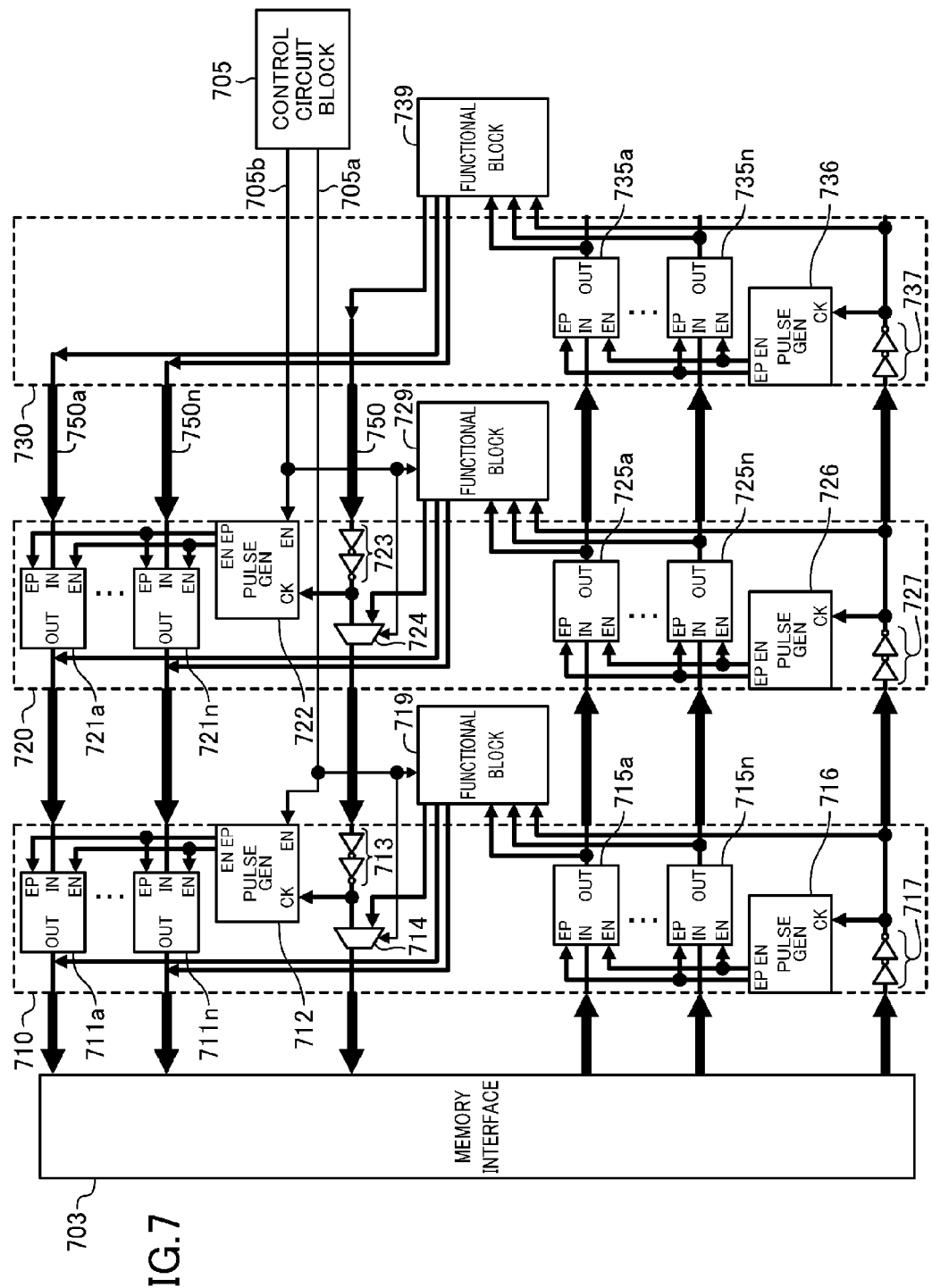
FIG. 7 is a block diagram showing a semiconductor integrated circuit according to a fourth embodiment of the present disclosure.

FIG. 7 is a block diagram showing a semiconductor integrated circuit according to a fourth embodiment. The semiconductor integrated circuit of FIG. 7 includes a memory interface block 703, functional blocks 719, 729, and 739, adjustment circuits 710, 720, and 730, and a control circuit block 705.

The adjustment circuit 710 includes tri-state circuits 711a, ..., and 711n, a pulse generator circuit 712, an inverter circuit 713, a selector circuit 714, tri-state circuits 715a, ..., and 715n, a pulse generator circuit 716, and an inverter circuit 717. Read data is input from the memory interface block 703 and is output to the functional block 719 and the adjustment circuit 720. Write data is input from the functional block 719 and the adjustment circuit 720, and a signal selected based on a control signal 705a input from the control circuit block 705 is output to the memory interface block 703. The inverter circuit 713 receives a clock signal from the adjustment circuit 720, and outputs the clock signal to the selector circuit 714 and the pulse generator circuit 712. The pulse generator circuit 712 receives the output signal of the inverter circuit 713 and the control signal 705a input from the control circuit block 705, and outputs a control signal for the tri-state circuits 711a, ..., and 711n. The pulse generator circuit 712, when controlled to be switched on based on the control signal 705a, outputs a pulsed signal to the tri-state circuits 711a, ..., and 711n, and when controlled to be switched off based on the control signal 705a, outputs a control signal which causes the tri-state circuits 711a, ..., and 711n to be maintained in the off state. The selector circuit 714 receives the output signal of the inverter circuit 713, the clock signal of the functional block 719, and the control signal 705a, and outputs these signals to the memory interface block 703. The selector circuit 714, when the pulse generator circuit 712 is controlled to be switched on based on the control signal 705a, selects the output signal of the inverter circuit 713, and when the pulse generator circuit 712 is controlled to be switched off based on the control signal 705a, selects and outputs the clock signal of the functional block 719 to the memory interface block 703. The inverter circuit 717 receives a clock signal from the memory interface block 703, and outputs the clock signal to the adjustment circuit 720 and the functional block 719. The pulse generator circuit 716 receives the output signal of the inverter circuit 717, and outputs a control signal for the tri-state circuits 715a, ..., and 715n.

The functional block 719 receives the output signals of the tri-state circuits 715a, ..., and 715n, the output signal of the inverter circuit 717, and the control signal 705a, and outputs a data signal to the output signals of the tri-state circuits 711a, ..., and 711n, and a clock signal to the input signal of the selector circuit 714. The functional block 719, when the pulse generator circuit 712 is controlled to be switched on based on the control signal 705a, causes data not to be output, and when the pulse generator circuit 712 is controlled to be switched off based on the control signal 705a, outputs a data signal to the output signals of the tri-state circuits 711a, ..., and 711n. The data signal output from the functional block 719 is synchronous with the clock signal output from the functional block 719, i.e., a source-synchronous configuration is established. To achieve this, the data signal and the clock signal are physically arranged side by side.

The adjustment circuit 720 includes tri-state circuits 721a, ..., and 721n, a pulse generator circuit 722, an inverter circuit 723, a selector circuit 724, tri-state circuits 725a, ..., and 725n, a pulse generator circuit 726, and an inverter circuit 727. Read data is input from the adjustment circuit 710 and is output to the functional block 729 and the adjustment circuit 730. Write data is input from the functional block 729 and the adjustment circuit 730, and a signal selected based on a control signal 705b input from the control circuit block 705 is output to the adjustment circuit 710. The inverter circuit 723 receives a clock signal from the adjustment circuit 730, and outputs the clock signal to the selector circuit 724 and the pulse generator circuit 722. The pulse generator circuit 722 receives the output signal of the inverter circuit 723 and the control signal 705b input from the control circuit block 705, and outputs a control signal for the tri-state circuits 721a, ..., and 721n. The pulse generator circuit 722, when controlled to be switched on based on the control signal 705b, outputs a pulsed signal to the tri-state circuits 721a, ..., and 721n, and when controlled to be switched off based on the control signal 705b, outputs a control signal which causes the tri-state circuits 721a, ..., and 721n to be maintained in the off state. The selector circuit 724 receives the output signal of the inverter circuit 723, the clock signal of the functional block 729, and the control signal 705b, and outputs these signals to the adjustment circuit 710. The selector circuit 724, when the pulse generator circuit 722 is controlled to be switched on based on the control signal 705b, selects the output signal of the inverter circuit 723, and when the pulse generator circuit 722 is controlled to be switched off based on the control signal 705b, selects and outputs the clock signal of the functional block 729 to the adjustment circuit 710. The inverter circuit 727 receives a clock signal from the adjustment circuit 710, and outputs the clock signal to the adjustment circuit 730 and the functional block 729. The pulse generator circuit 726 receives the output signal of the inverter circuit 727, and outputs a control signal for the tri-state circuits 725a, ..., and 725n.

The functional block 729 receives the output signals of the tri-state circuits 725a, ..., and 725n, the output signal of the inverter circuit 727, and the control signal 705b, and outputs a data signal to the output signals of the tri-state circuits 721a, ..., and 721n, and a clock signal to the input signal of the selector circuit 724. The functional block 729, when the pulse generator circuit 722 is controlled to be switched on based on the control signal 705b, causes data not to be output, and when the pulse generator circuit 722 is controlled to be switched off based on the control signal 705b, outputs a data signal to the output signals of the tri-state circuits 721a, ..., and 721n. The data signal output from the functional block 729 is synchronous with the clock signal output from the functional block 729, i.e., a source-synchronous configuration is established. To achieve this, the data signal and the clock signal are physically arranged side by side.

The adjustment circuit 730 includes tri-state circuits 735a, ..., and 735n, a pulse generator circuit 736, and an inverter circuit 737. Read data is input from the adjustment circuit 720 and is output to the functional block 739. Write data is input from the functional block 739, and is output to data signals 750a, ..., and 750n and a clock signal 750. The inverter circuit 737 receives a clock signal from the adjustment circuit 720, and outputs the clock signal to the functional block 739. The pulse generator circuit 736 receives the output signal of the inverter circuit 737, and outputs a control signal for the tri-state circuits 735a, . . . , and 735n.

The functional block 739 receives the output signals of the tri-state circuits 735a, . . . , and 735n and the output signal of the inverter circuit 737, and outputs a data signal to the data signals 750a, . . . , and 750n, and a clock signal to the clock signal 750. The data signal output from the functional block 739 is synchronous with the clock signal output from the functional block 739, i.e., a source-synchronous configuration is established. To achieve this, the data signal and the clock signal are physically arranged side by side.

Note that, in this configuration, the data signal is selected by the tri-state circuit and the clock signal is selected by the selector circuit. Alternatively, the data signal is selected by the selector circuit and the clock signal is selected by the tri-state circuit. In this case, similar advantages are obtained.

Figure 8:
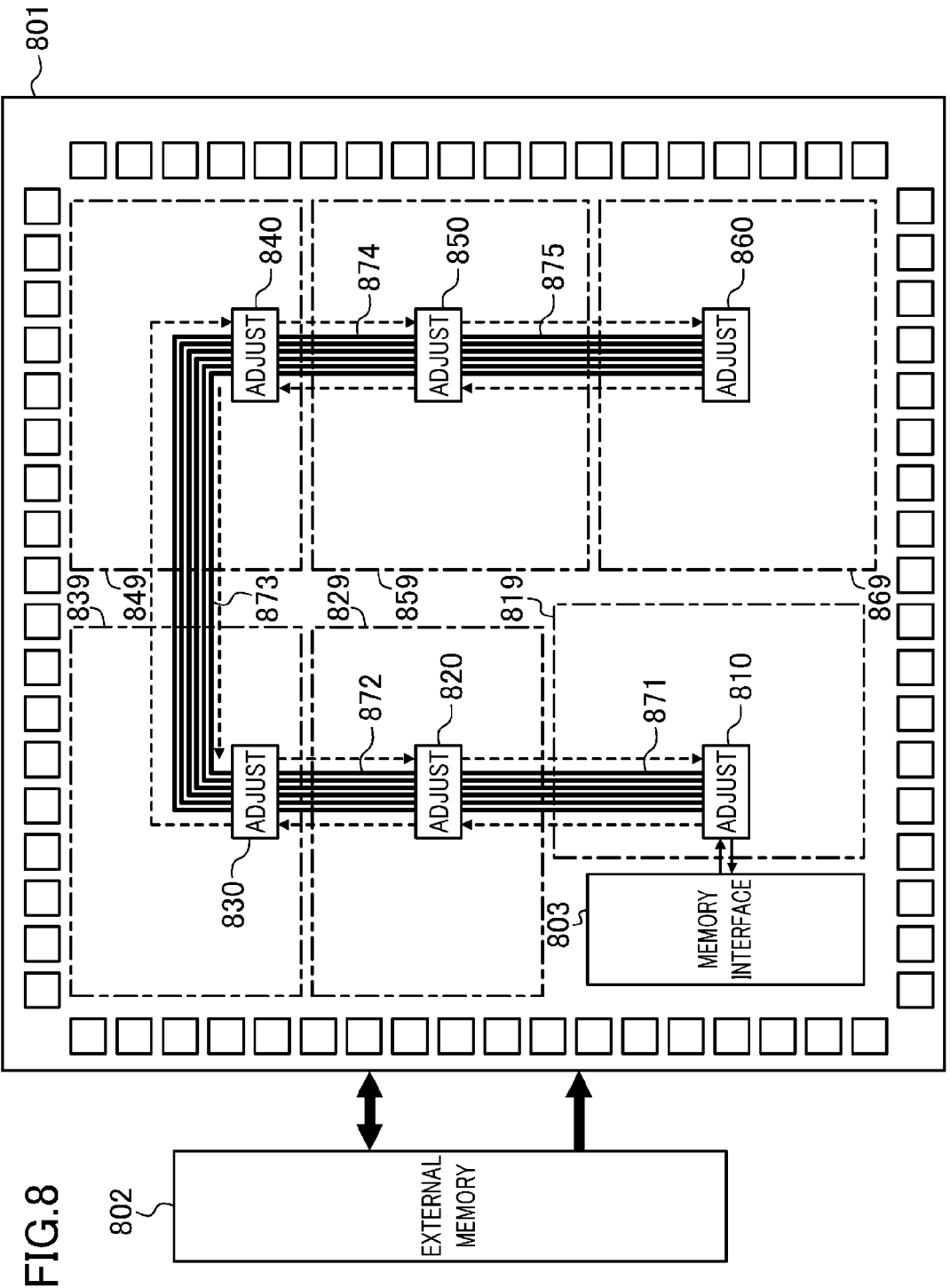
FIG. 8 is a diagram showing an example layout of the semiconductor integrated circuit of the fourth embodiment of the present disclosure.

FIG. 8 shows an example layout of a semiconductor integrated circuit 801 according to the fourth embodiment. The semiconductor integrated circuit 801 of FIG. 8 includes a memory interface block 803, functional blocks 819, 829, 839, 849, 859, and 869, long-distance signals 871, 872, 873, 874, and 875, and adjustment circuits 810, 820, 830, 840, 850, and 860. The semiconductor integrated circuit 801 receives and outputs a data signal and a control signal (e.g., an address etc.) from and to an external memory 802.

The memory interface block 803 outputs a data signal and a clock signal read from the external memory 802 to the adjustment circuit 810, and receives from the adjustment circuit 810 a data signal and a clock signal to be written to the external memory 802. The adjustment circuit 810 outputs the read data signal and the read clock signal as the long-distance signal 871 to the adjustment circuit 820 and the functional block 819, and receives the write data signal and the write clock signal from the adjustment circuit 820 and the functional block 819. The adjustment circuit 820 outputs the read data signal and the read clock signal as the long-distance signal 872 to the adjustment circuit 830 and the functional block 829, and receives the write data signal and the write clock signal from the adjustment circuit 830 and the functional block 829. The adjustment circuit 830 outputs the read data signal and the read clock signal as the long-distance signal 873 to the adjustment circuit 840 and the functional block 839, and receives the write data signal and the write clock signal from the adjustment circuit 840 and the functional block 839. The adjustment circuit 840 outputs the read data signal and the read clock signal as the long-distance signal 874 to the adjustment circuit 850 and the functional block 849, and receives the write data signal and the write clock signal from the adjustment circuit 850 and the functional block 849. The adjustment circuit 850 outputs the read data signal and the read clock signal as the long-distance signal 875 to the adjustment circuit 860 and the functional block 859, and receives the write data signal and the write clock signal from the adjustment circuit 860 and the functional block 859. The adjustment circuit 860 outputs the read data signal and the read clock signal to the functional block 869, and receives the write data signal and the write clock signal from the functional block 869.

Figure 9:
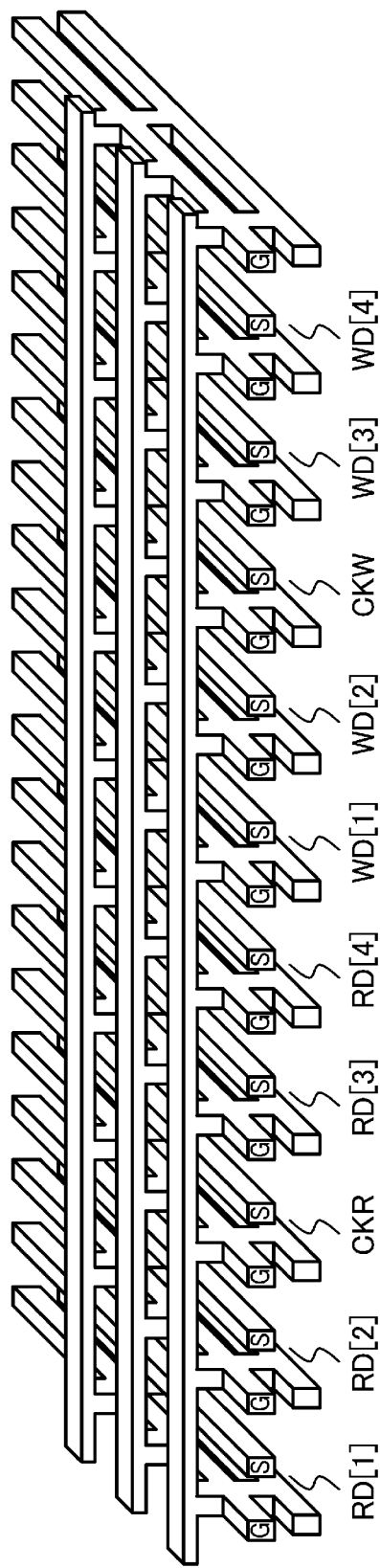
FIG. 9 is a cross-sectional view of long-distance interconnects in the fourth embodiment of the present disclosure.

FIG. 9 is a cross-sectional view of long-distance interconnects as viewewd in an interconnect length direction, showing an example layout of the long-distance signals 871, 872, 873, 874, and 875 of FIG. 8. These long-distance signals include a plurality of read data signals RD, a read clock signal CKR, a plurality of write data signals WD, and a write clock signal CKW. The read data signal RD and the write data signal WD are shielded by a power supply or a ground (G) provided on opposite sides thereof in order to provide a uniform impedance of an interconnect (S) and eliminate an influence of crosstalk.

FIG. 9 shows an example configuration in which the read data signal RD and the write data signal WD are each of four bits. The read data signal RD and the write data signal WD are shielded by a ground (G). Half the bits of the read data signal RD are provided on each of the opposite sides of the read clock signal CKR. Specifically, these signals are arranged in the following order: RD[1], RD[2], CKR, RD[3], RD[4]. Half the bits of the write data signal WD are provided on each of the opposite sides of the write clock signal CKW. Specifically, these signals are arranged in the following order: WD[1], WD[2], CKW, WD[3], WD[4]. Of course, the bit sequence may be reversed, i.e., the signals may be arranged in the following order: RD[4], RD[3], CKR, RD[2], RD[1].

With this layout structure, the pulse generator circuit is provided at a center of the data signals so that a pulse signal can be interconnected in a direction orthogonal to interconnects. Moreover, the long-distance signals 871, 872, 873, 874, and 875 may be arranged in the same bit sequence, whereby bit skew can be more easily adjusted.

Figure 10:
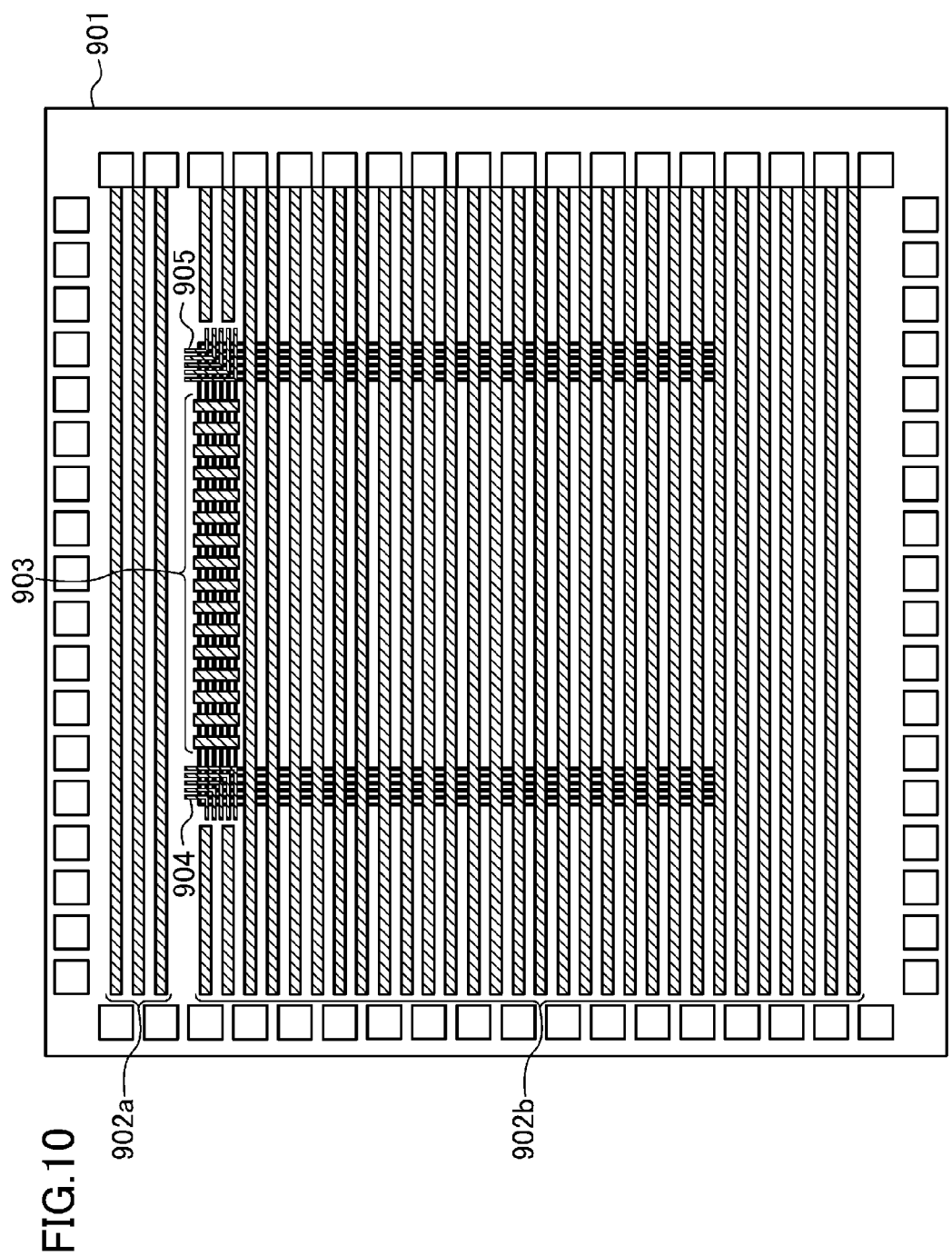
FIG. 10 is a diagram showing power supply interconnects in the semiconductor integrated circuit of the fourth embodiment of the present disclosure.

FIG. 10 shows an example layout of power supply interconnects for the long-distance signals. In a semiconductor integrated circuit 901, horizontal interconnects 902a and 902b are each a topmost power supply or a ground interconnect. The long-distance signal is interconnected using a layer immediately below the horizontal interconnects 902a and 902b. All the bits of the long-distance signal orthogonal to the horizontal interconnects 902a and 902b have the constant characteristic impedance with respect to the power supply interconnect. However, the long-distance interconnects provided in parallel with the horizontal interconnects 902a and 902b have characteristic impedances with respect to the power supply interconnect, which vary among bits when arranged as with the horizontal interconnects 902b. This is because the power supply may be present on some long-distance interconnects and absent on the other long-distance interconnects. Therefore, for the long-distance interconnects provided in parallel with the horizontal interconnects 902a and 902b, the power supply needs to be arranged as with vertical interconnects 903. In a portion where long-distance interconnects are bent, power supply interconnects are invariably arranged in perpendicular to long-distance interconnects, as with power supplies 904 and 905.

By providing such power supply interconnects, the variations in the characteristic impedance with respect to the power supply interconnects among the bits of the long-distance interconnects are reduced or prevented.

Fifth Embodiment

In a fifth embodiment, example applications of the above semiconductor integrated circuit (any of the semiconductor integrated circuits of the third and fourth embodiments) will be described.

<First Application>

Figure 11:
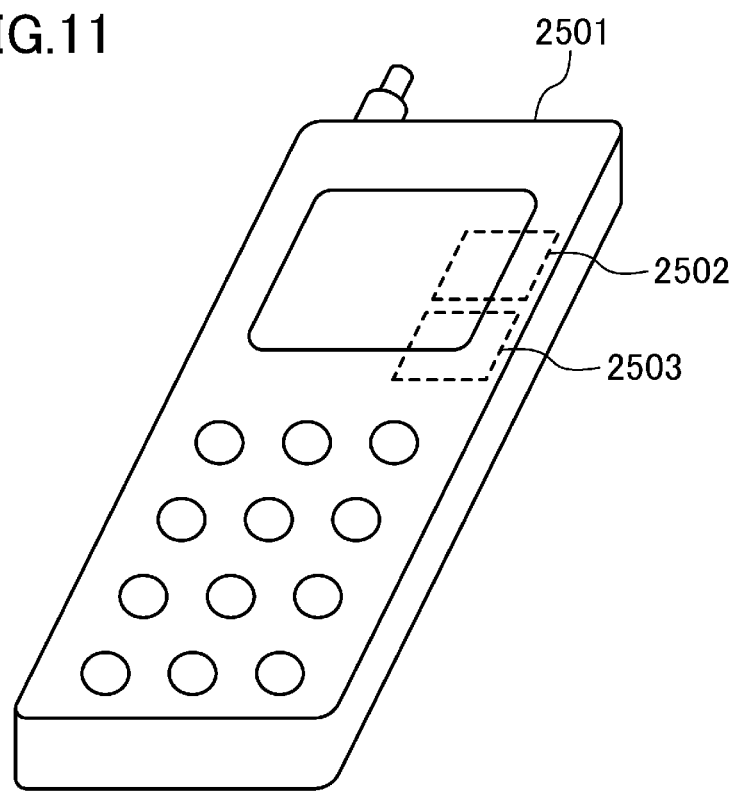
FIG. 11 is a diagram schematically showing a mobile telephone which is an example communication device including a semiconductor integrated circuit according to the present disclosure.

FIG. 11 schematically shows a mobile telephone which is an example communication device including the semiconductor integrated circuit of the present disclosure. The mobile telephone 2501 of FIG. 11 includes a baseband LSI 2502 and an application LSI 2503. Each circuit block in the baseband LSI 2502 and the application LSI 2503 receives or transmits a wireless signal or a wired signal via a high-frequency transmission/reception interface section and an external input/output interface section. Note that semiconductor integrated circuits included in the mobile telephone 2501 other than the baseband LSI 2502 and the application LSI 2503 may include the semiconductor integrated circuit of the present disclosure as a logic circuit thereof, and in this case, advantages similar to those described above can be obtained.

Figure 12:
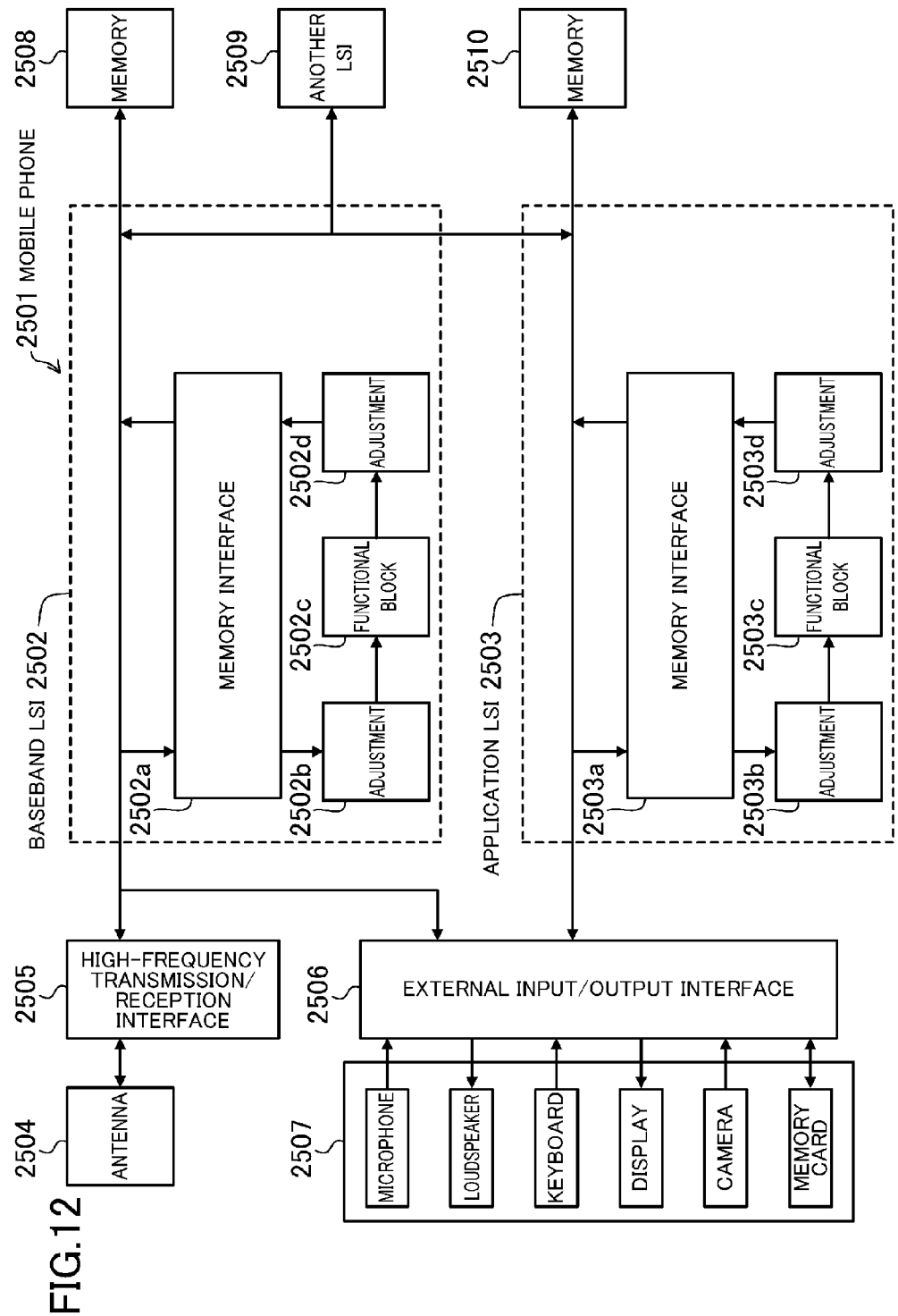
FIG. 12 is a block diagram showing a configuration of the mobile telephone of FIG. 11.

FIG. 12 is a block diagram showing a relationship between the present disclosure and the mobile telephone. Blocks of FIG. 12 are only designated by names in the figure and will not be described in detail.

The baseband LSI 2502 is a circuit block which is a basic component of the communication device. The application LSI 2503 has a circuit block which is an application-like component in the communication device.

Specifically, the baseband LSI 2502 includes a memory interface block 2502*a* which receives a signal from circuitry external to the LSI, an adjustment circuit 2502*b* which receives data from the memory interface block 2502*a*, a functional block 2502*c* which receives data from the adjustment circuit 2502*b*, and an adjustment circuit 2502*d* which receives data from the functional block 2502*c*. The memory interface block 2502*a* and the adjustment circuits 2502*b* and 2502*d* are the memory interface block and the adjustment circuit of the third or fourth embodiment.

The application LSI 2503 includes a memory interface block 2503*a* which receives a signal from circuitry external to the LSI, an adjustment circuit 2503*b* which receives data from the memory interface block 2503*a*, a functional block 2503*c* which receives data from the adjustment circuit 2503*b*, and an adjustment circuit 2503*d* which receives data from the functional block 2503*c*. The memory interface block 2503*a* and the adjustment circuits 2503*b* and 2503*d* are the memory interface block and the adjustment circuit of the third or fourth embodiment.

With this configuration, the baseband LSI 2502 and the application LSI 2503 can execute communication between circuitry external to the LSI and a functional block in the LSI at high speed.

A reference character 2504 indicates an antenna. A reference character 2505 indicates a high-frequency transmission/reception interface section. A reference character 2506 indicates an external input/output interface section. A reference character 2507 indicates a functional section including a microphone, a loudspeaker, a keyboard, a display, a camera, and a memory card. A reference character 2508 indicates a memory. A reference character 2509 indicates another LSI circuit. A reference character 2510 indicates a memory.

Each circuit block in the baseband LSI 2502 and the application LSI 2503 receives or transmits a wireless signal or a wired signal via the high-frequency transmission/reception interface section 2505 and the external input/output interface section 2506.

Note that FIG. 12 shows an example relationship between the present disclosure and the communication device, and the function of the mobile telephone 2501 is not limited to this. A function may be added and the configuration may be changed unless a problem arises with the system. A function included in each LSI circuit may be arbitrarily changed if the function can be integrated into the LSI circuit.

The communication device including the semiconductor integrated circuit of the present disclosure is not limited to a mobile telephone. In addition to this, the communication device may be, for example, a transmitter or a receiver in a communication system, a modem device for data transmission, etc. In other words, the present disclosure can execute communication between circuitry external to LSI and a functional block in the LSI at high speed in any communication device irrespective of whether it is wired or wireless, optical or electrical, or digital or analog.

<Second Application>

Figure 13:
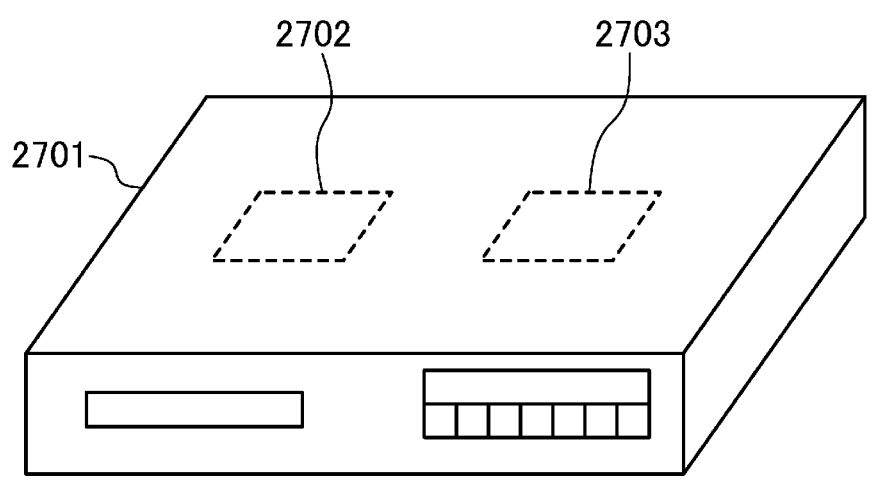
FIG. 13 is a diagram schematically showing an optical disk device which is an example information reproduction device including a semiconductor integrated circuit according to the present disclosure.

FIG. 13 schematically shows an optical disk device which is an example information reproduction device including a semiconductor integrated circuit according to the present disclosure. The optical disk device 2701 of FIG. 13 includes a medium signal processing LSI 2702 which processes a signal read from an optical disk (not shown), and an error correction/servo processing LSI 2703 which performs error correction on the signal and servo control on an optical pickup. The medium signal processing LSI 2702 and the error correction/servo processing LSI 2703 are each a semiconductor integrated circuit according to the present disclosure.

Figure 14:
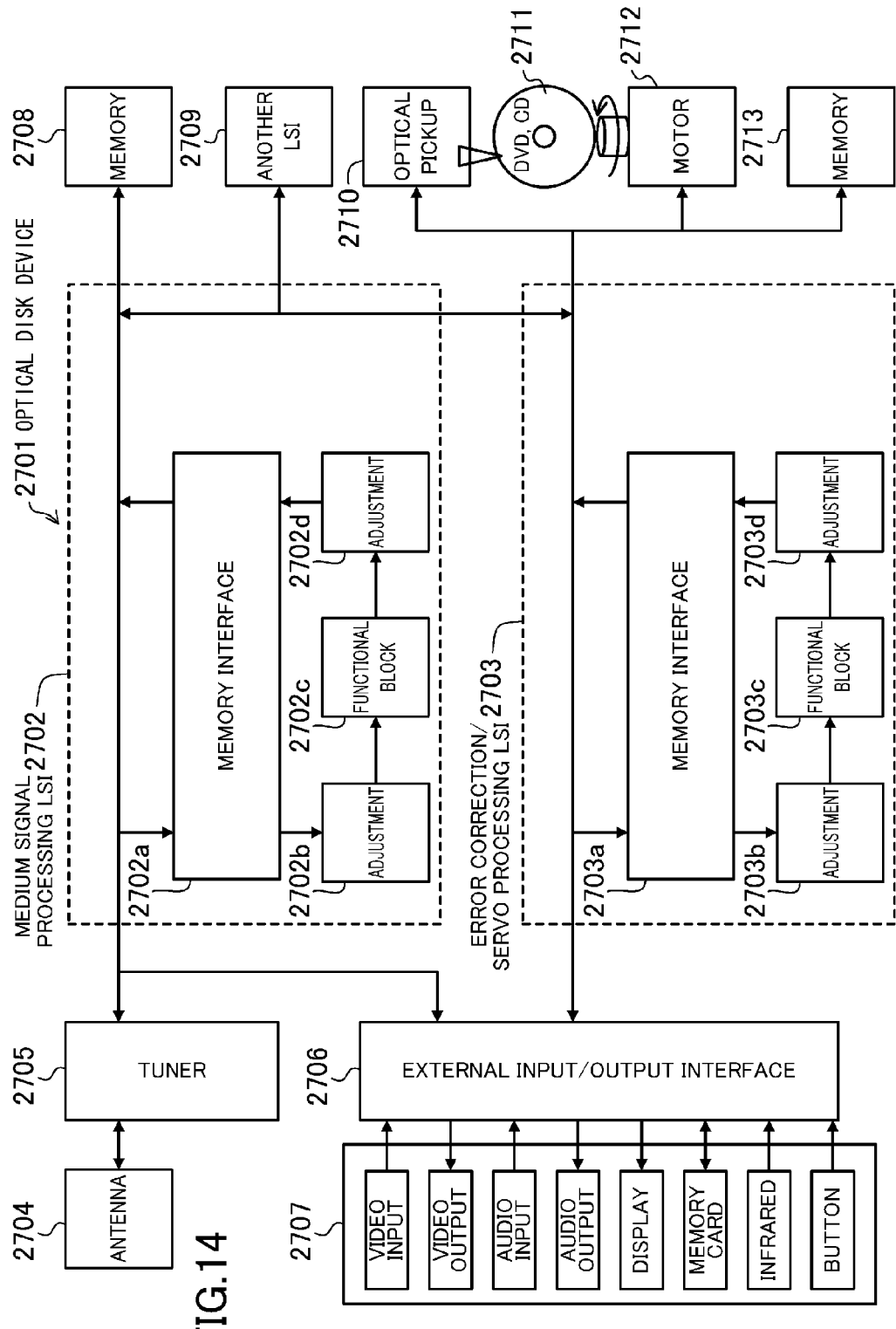
FIG. 14 is a block diagram showing a configuration of the optical disk device of FIG. 13.

FIG. 14 is a block diagram showing a relationship between the present disclosure and the optical disk device. Blocks of FIG. 14 are only designated by names in the figure and will not be described in detail.

The medium signal processing LSI 2702 has a circuit block which is a basic component of the device for processing a medium signal. The error correction/servo processing LSI 2703 has a circuit block which performs error correction/servo processing in the device.

Specifically, the medium signal processing LSI 2702 includes a memory interface block 2702*a* which receives a signal from circuitry external to the LSI, an adjustment circuit 2702*b* which receives data from the memory interface block 2702*a*, a functional block 2702*c* which receives data from the adjustment circuit 2702*b*, and an adjustment circuit 2702*d* which receives data from the functional block 2702*c*. The memory interface block 2702*a* and the adjustment circuits 2702*b* and 2702*d* are each the memory interface block or the adjustment circuit described in the third or fourth embodiment.

The error correction/servo processing LSI 2703 includes a memory interface block 2703*a* which receives a signal from circuitry external to the LSI, an adjustment circuit 2703*b* which receives data from the memory interface block 2703*a*, a functional block 2703*c* which receives data from the adjustment circuit 2703*b*, and an adjustment circuit 2703*d* which receives data from the functional block 2703*c*. The memory interface block 2703*a* and the adjustment circuits 2703*b* and 2703*d* are each the memory interface block or the adjustment circuit described in the third or fourth embodiment.

With this configuration, the medium signal processing LSI 2702 and the error correction/servo processing LSI 2703 can execute communication between circuitry external to the LSI and a functional block in the LSI at high speed.

A reference character 2704 indicates an antenna. A reference character 2705 indicates a tuner section. A reference character 2706 indicates an external input/output interface section. A reference character 2707 indicates a functional section including a video input, a video output, an audio input, an audio output, a display, a memory card, an infrared, and a button. A reference character 2708 indicates a memory. A reference character 2709 indicates another LSI circuit. A reference character 2710 indicates an optical pickup section. A reference character 2711 indicates a DVD or CD section. A reference character 2712 indicates a motor section. A reference character 2713 indicates a memory.

Note that FIG. 14 shows an example relationship between the present disclosure and the optical disk device, and the function of the optical disk device 2701 is not limited to this. A function may be added and the configuration may be changed unless a problem arises with the system. A function included in each LSI circuit may be arbitrarily changed if the function can be integrated into the LSI circuit.

The information reproduction device including the semiconductor integrated circuit of the present disclosure is not limited to an optical disk device. In addition to this, the information reproduction device may be, for example, an image recording/reproduction device including a magnetic disk, an information recording/reproduction device including a semiconductor memory as a medium, etc. In other words, according to the present disclosure, communication can be executed between circuitry external to the LSI and a functional block in the LSI at high speed for any information reproduction device (an information recording function may be included) irrespective of what type of medium for recording information is included in the information reproduction device.

<Third Application>

Figure 15:
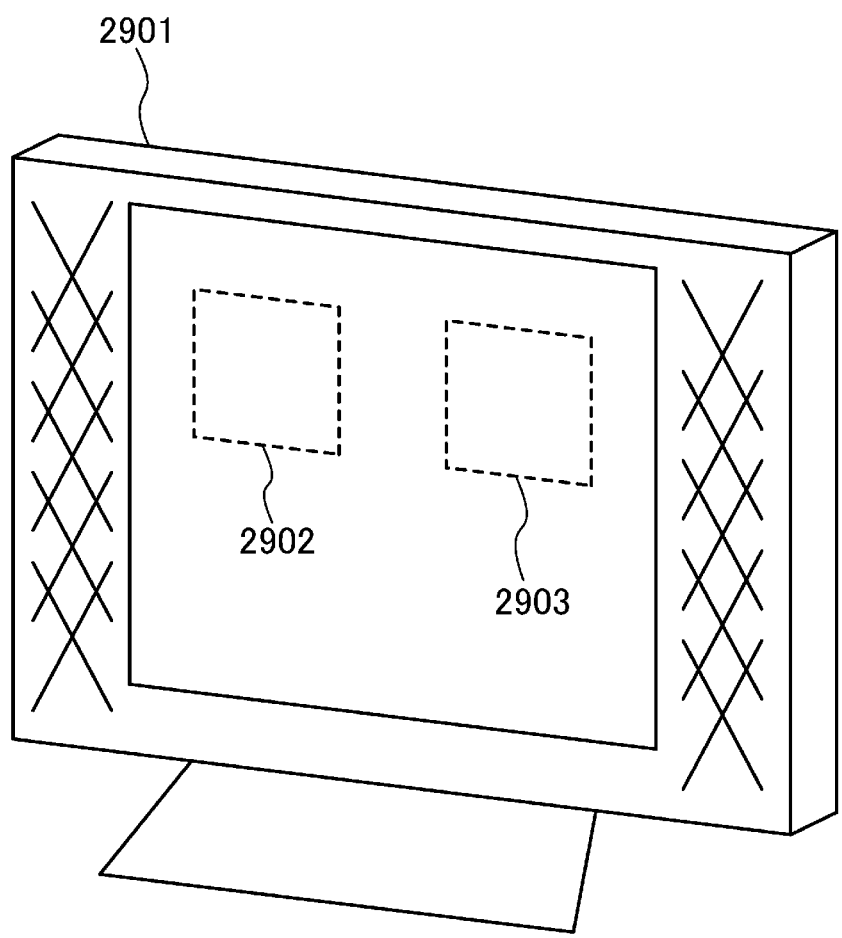
FIG. 15 is a diagram schematically showing a television set which is an example image display device including a semiconductor integrated circuit according to the present disclosure.

FIG. 15 schematically shows a television set which is an example image display device including a semiconductor integrated circuit according to the present disclosure. The television set 2901 of FIG. 15 includes an audio/video processing LSI 2902 which processes an video signal and an audio signal, and a display/sound source control LSI 2903 which controls a device, such as a display screen, a loudspeaker, etc. The audio/video processing LSI 2902 and the display/sound source control LSI 2903 are each a semiconductor integrated circuit according to the present disclosure.

Figure 16:
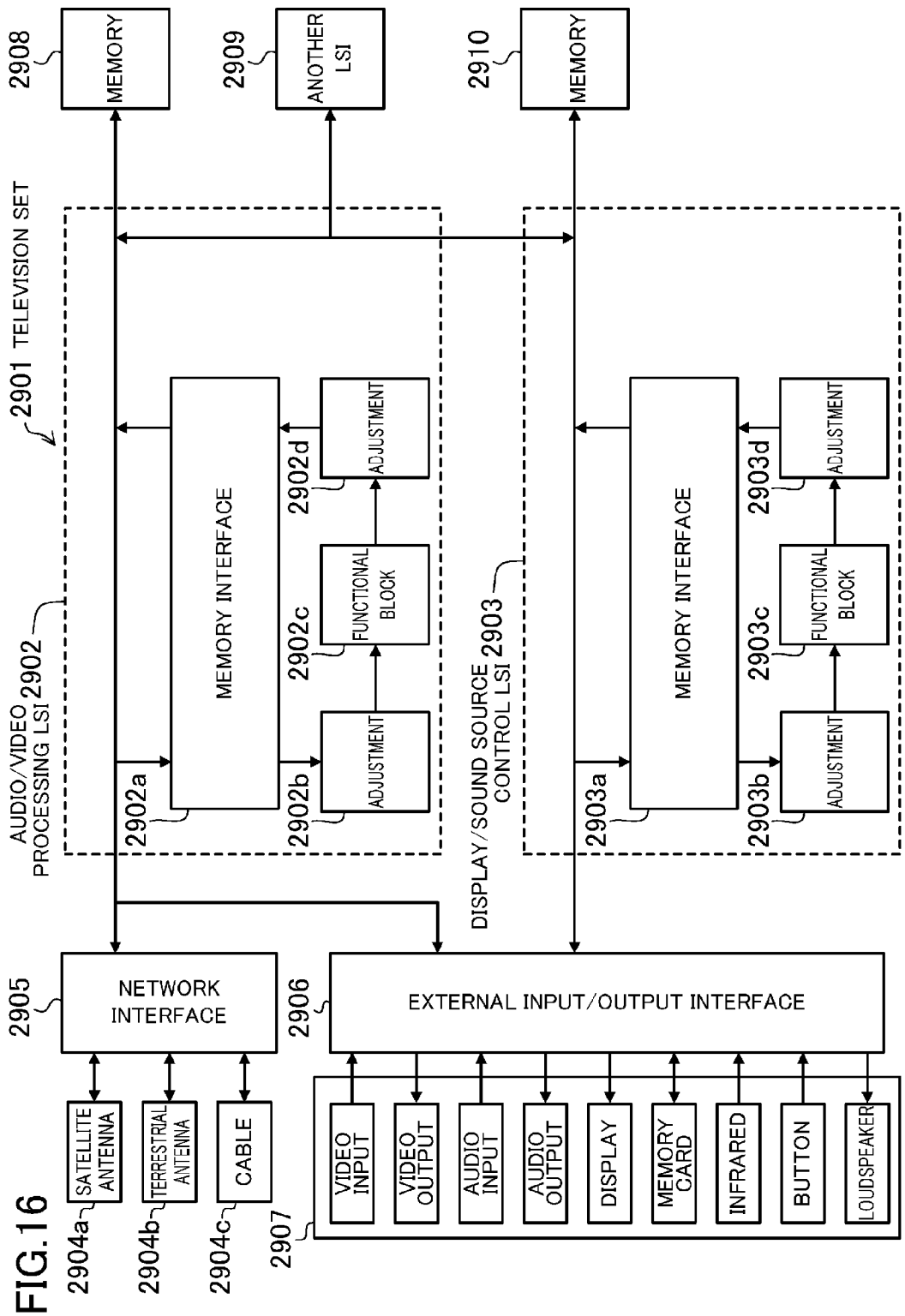
FIG. 16 is a block diagram showing a configuration of the television set of FIG. 15.

FIG. 16 is a block diagram showing a relationship between the present disclosure and the television set. Blocks of FIG. 16 are only designated by names in the figure and will not be described in detail.

The audio/video processing LSI 2902 is a circuit block which is a component which performs audio/video processing in this device. The display/sound source control LSI 2903 has a circuit block which is a component which controls a display and an audio source in this device.

Specifically, the audio/video processing LSI 2902 includes a memory interface block 2902a which receives a signal from circuitry external to the LSI, an adjustment circuit 2902b which receives data from the memory interface block 2902a, an functional block 2902c which receives data from the adjustment circuit 2902b, and an adjustment circuit 2902d which receives data from the functional block 2902c. The memory interface block 2902a and the adjustment circuits 2902b and 2902d are each the memory interface block or the adjustment circuit described in the third or fourth embodiment.

The display/sound source control LSI 2903 includes a memory interface block 2903a which receives a signal from circuitry external to the LSI, an adjustment circuit 2903b which receives data from the memory interface block 2903a, a functional block 2903c which receives data from the adjustment circuit 2903b, and an adjustment circuit 2903d which receives data from the functional block 2903c. The memory interface block 2903a and the adjustment circuits 2903b and 2903d are each the memory interface block or the adjustment circuit described in the third or fourth embodiment.

With this configuration, the audio/video processing LSI 2902 and the display/sound source control LSI 2903 can execute communication between circuitry external to the LSI and a functional block in the LSI at high speed.

A reference character 2904a indicates a satellite antenna. A reference character 2904b indicates a terrestrial antenna. A reference character 2904c indicates a cable. A reference character 2905 indicates a network interface section. A reference character 2906 indicates an external input/output interface section. A reference character 2907 indicates a functional section including a video input, a video output, an audio input, an audio output, a display, a memory card, an infrared, a button, and a loudspeaker. A reference character 2908 indicates a memory. A reference character 2909 indicates another LSI circuit. A reference character 2910 indicates a memory.

Note that FIG. 16 shows an example relationship between the present disclosure and the information reproduction device, and the function of the television set 2901 is not limited to this. A function may be added and the configuration may be changed unless a problem arises with the system. A function included in each LSI circuit may be arbitrarily changed if the function can be integrated into the LSI circuit.

The image display device including a semiconductor integrated circuit according to the present disclosure is not limited to a television set. In addition to this, the image display device may be, for example, a device which displays streaming data distributed via an electrical communication line. In other words, according to the present disclosure, communication can be executed between circuitry external to the LSI and a functional block in the LSI at high speed for any image display device irrespective of what type of information transmission technique is used in the image display device.

<Fourth Application>

Figure 17:
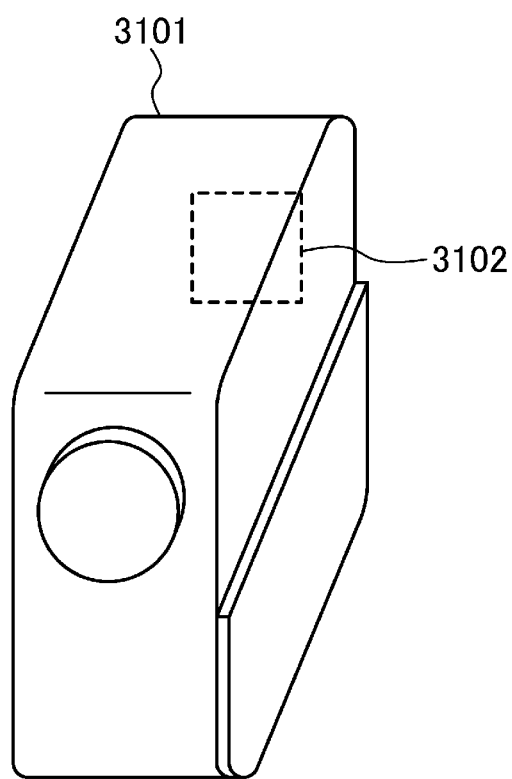
FIG. 17 is a diagram schematically showing a digital camera which is an example electronic device including a semiconductor integrated circuit according to the present disclosure.

FIG. 17 schematically shows a digital camera which is an example electronic device including a semiconductor integrated circuit according to the present disclosure. The digital camera 3101 of FIG. 17 includes a signal processing LSI 3102 which is a semiconductor integrated circuit according to the present disclosure.

Figure 18:
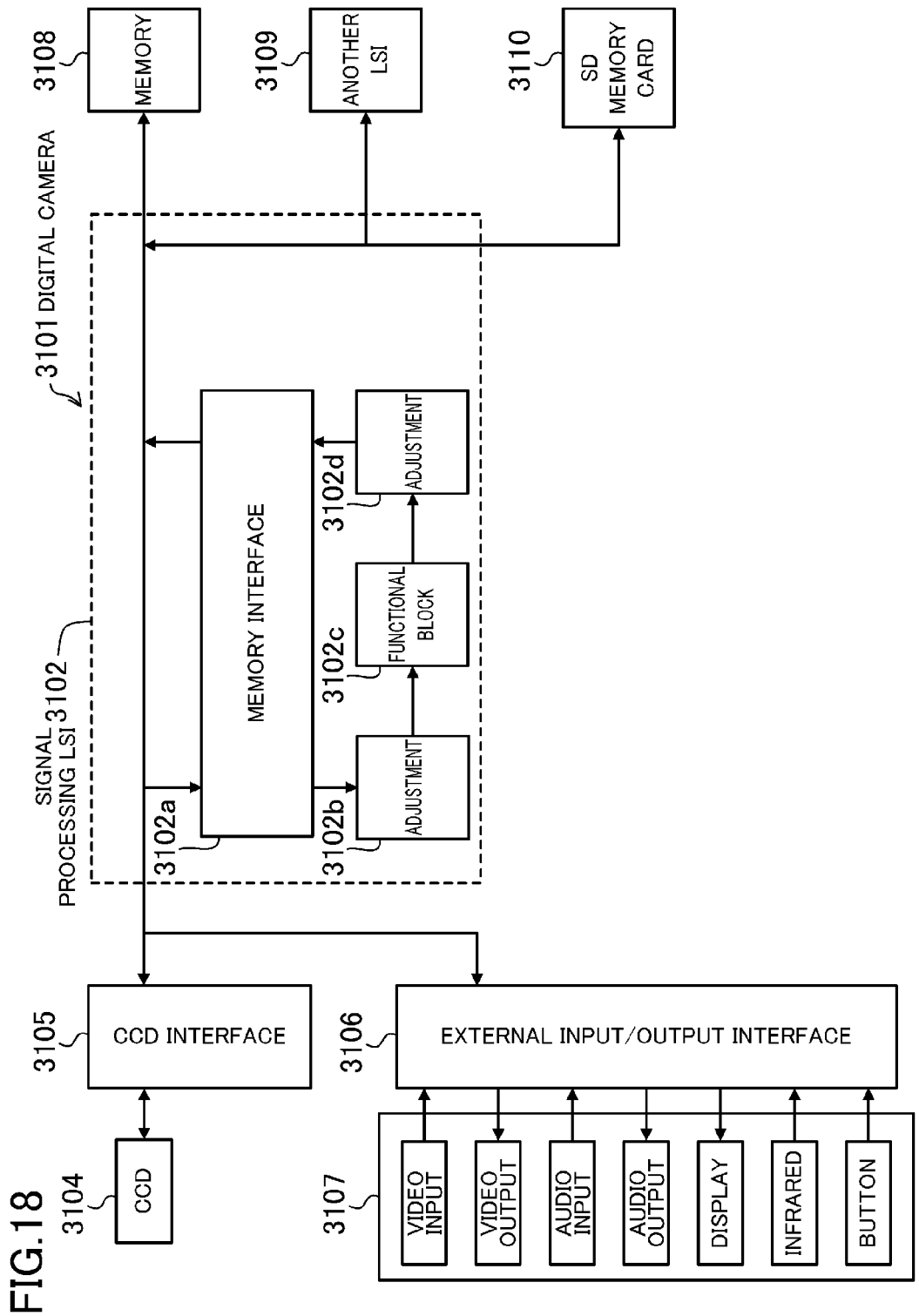
FIG. 18 is a block diagram showing a configuration of the digital camera of FIG. 17.

FIG. 18 is a block diagram showing a relationship between the present disclosure and the electronic device. Blocks of FIG. 18 are only designated by names in the figure and will not be described in detail.

The signal processing LSI 3102 includes a memory interface block 3102a which receives a signal from circuitry external to the LSI, an adjustment circuit 3102b which receives data from the memory interface block 3102a, a functional block 3102c which receives data from the adjustment circuit 3102b, and an adjustment circuit 3102d which receives data from the functional block 3102c. The memory interface block 3102a and the adjustment circuits 3102b and 3102d are each the memory interface block or the adjustment circuit described in the third or fourth embodiment.

With this configuration, the signal processing LSI 3102 can execute communication between circuitry external to the LSI and a functional block in the LSI at high speed.

A reference character 3104 indicates a CCD. A reference character 3105 indicates a CCD interface section. A reference character 3106 indicates an external input/output interface section. A reference character 3107 indicates a functional section including a video input, a video output, an audio input, an audio output, a display, an infrared, and a button. A reference character 3108 indicates a memory. A reference character 3109 indicates another LSI circuit. A reference character 3110 indicates an SD memory card.

Note that FIG. 18 shows an example relationship between the present disclosure and the electronic device, and the function of the digital camera 3101 is not limited to this. A function may be added and the configuration may be changed unless a problem arises with the system. A function included in each LSI circuit may be arbitrarily changed if the function can be integrated into the LSI circuit.

The electronic device including a semiconductor integrated circuit according to the present disclosure is not limited to a digital camera. In addition to this, the electronic device may be, for example, a general device including a semiconductor integrated circuit, such as sensors, electronic calculators, etc. According to the present disclosure, commu- <Fifth Application>

Figure 19:
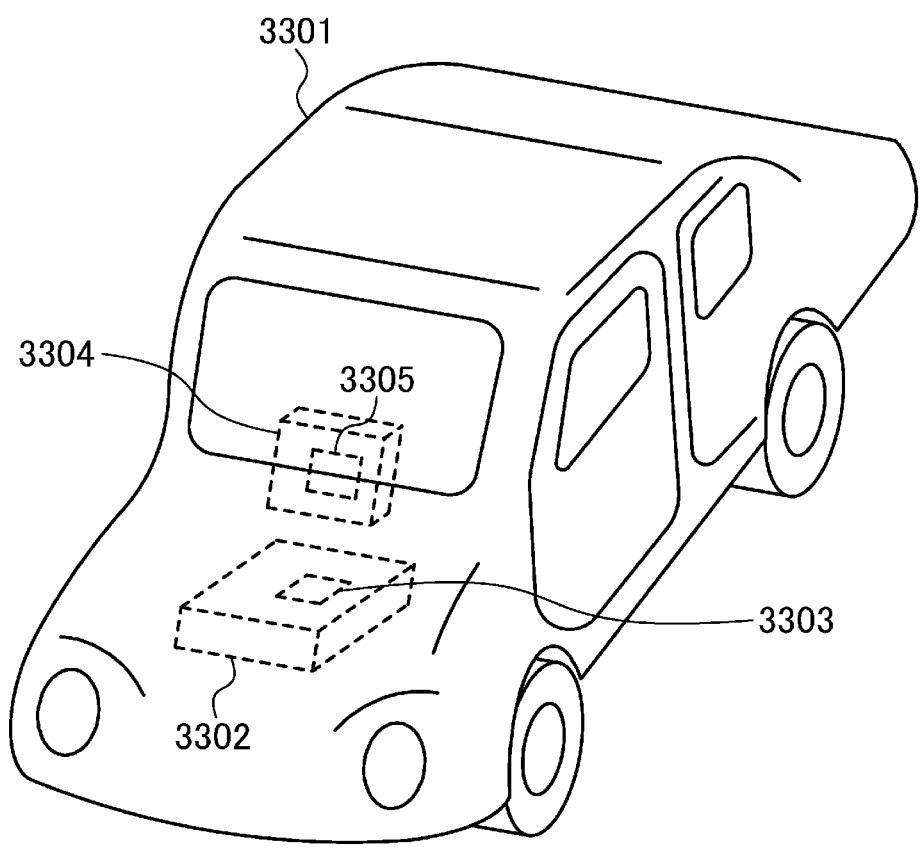
FIG. 19 is a diagram schematically showing a car which is an example mobile object including a semiconductor integrated circuit according to the present disclosure.

FIG. 19 schematically shows an electronic control device including a semiconductor integrated circuit according to the present disclosure and a car which is an example mobile object including the electronic control device. The car 3301 of FIG. 19 includes an electronic control device 3302. The electronic control device 3302 includes a semiconductor integrated circuit according to the present disclosure, and an engine/transmission control LSI 3303 which controls the engine, transmission, etc. of the car 3301. The car 3301 also includes a navigation device 3304. The navigation device 3304 includes a navigation LSI 3305 which is a semiconductor integrated circuit according to the present disclosure, as with the electronic control device 3302.

Figure 20:
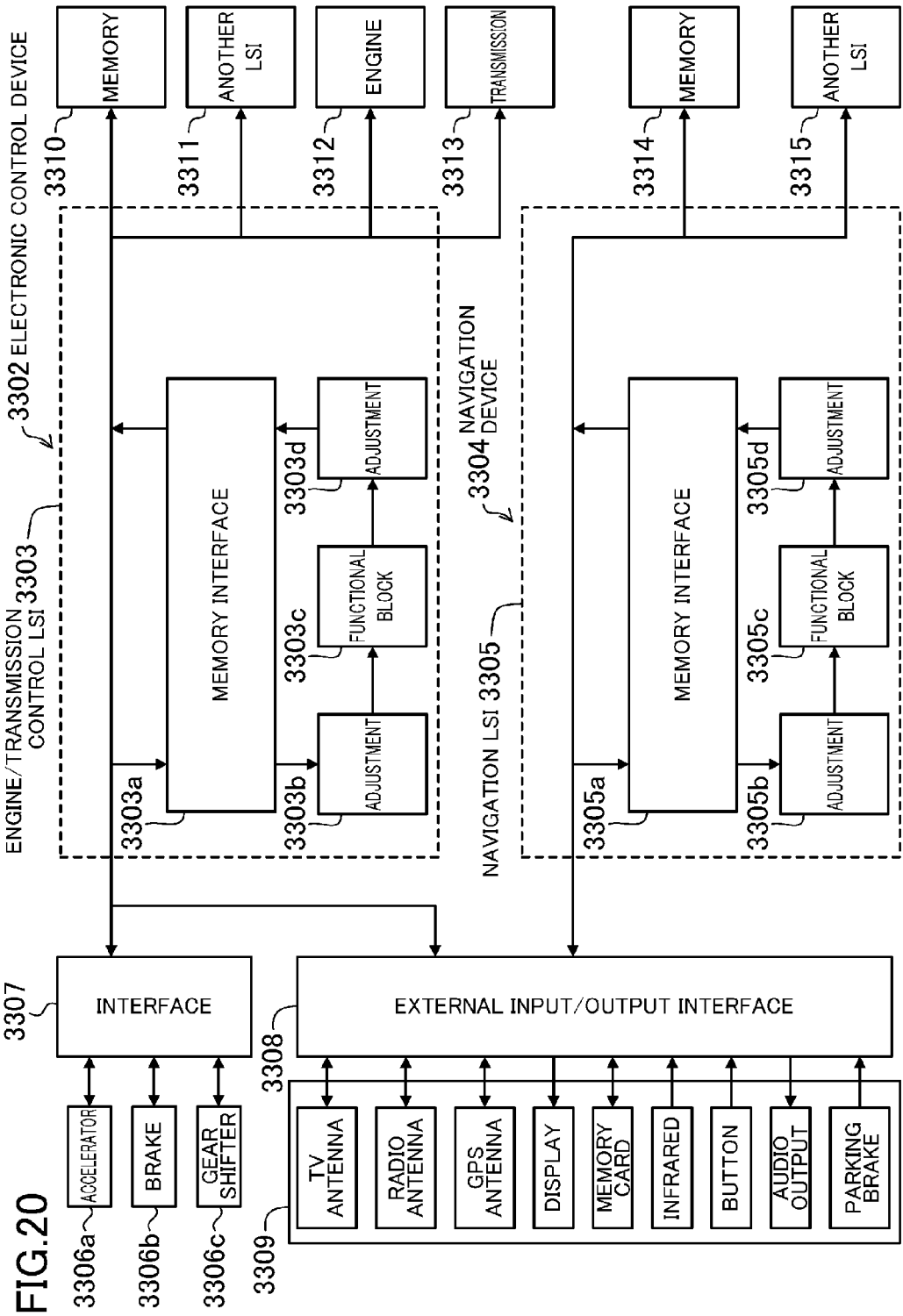
FIG. 20 is a block diagram showing a configuration of an electronic control device and a navigation device in the car of FIG. 19.
Figure 21:
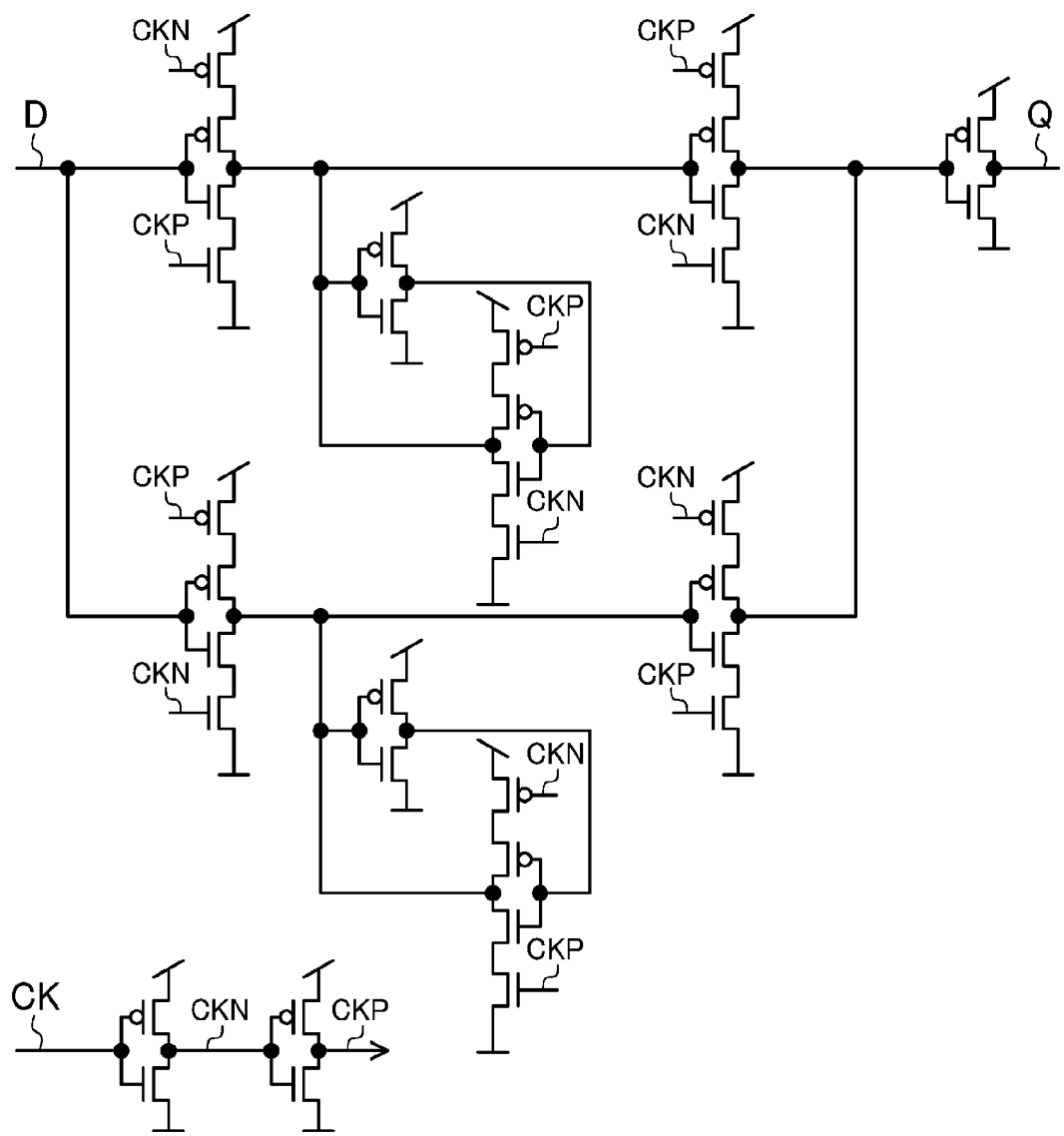
FIG. 21 is a diagram showing an example of a conventional double edge triggered latch.
Figure 22:
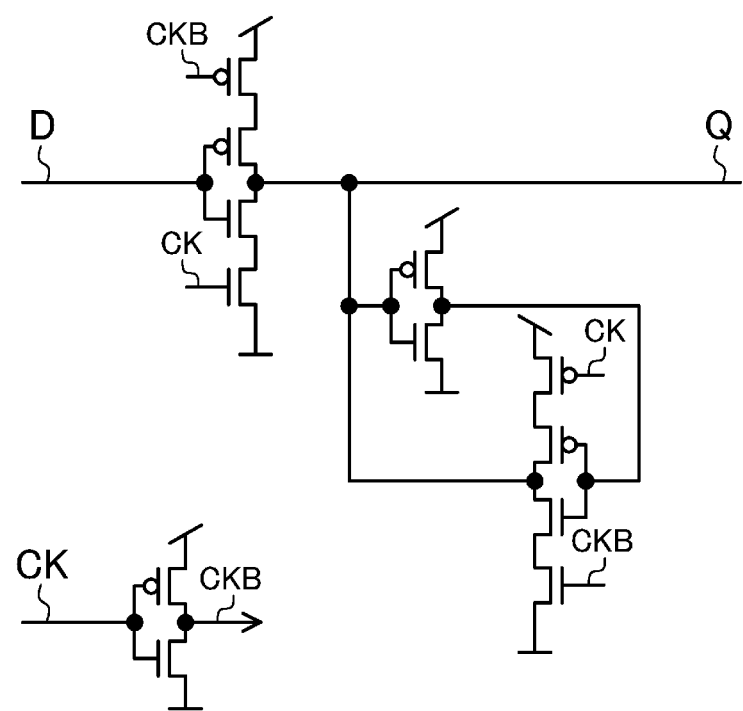
FIG. 22 is a diagram showing an example of a conventional level triggered latch.

FIG. 20 is a block diagram showing a relationship between the present disclosure, and the electronic control device and the car which is an example mobile object including the electronic control device. Blocks of FIG. 20 are only designated by names in the figure and will not be described in detail.

The engine/transmission control LSI 3303 is a circuit block which is a component which performs engine/transmission control in this device, and the navigation LSI 3305 has a circuit block which performs a navigation process in this device.

Specifically, the engine/transmission control LSI 3303 includes a memory interface block 3303a which receives a signal from circuitry external to the LSI, an adjustment circuit 3303b which receives data from the memory interface block 3303a, a functional block 3303c which receives data from the adjustment circuit 3303b, and an adjustment circuit 3303d which receives data from the functional block 3303c. The memory interface block 3303a and the adjustment circuits 3303b and 3303d are each the memory interface block or the adjustment circuit described in the third or fourth embodiment.

The navigation LSI 3305 includes a memory interface block 3305a which receives a signal from circuitry external to the LSI, an adjustment circuit 3305b which receives data from the memory interface block 3305a, a functional block 3305c which receives data from the adjustment circuit 3305b, and an adjustment circuit 3305d which receives data from the functional block 3305c. The memory interface block 3305a and the adjustment circuits 3305b and 3305d are each the memory interface block or the adjustment circuit described in the third or fourth embodiment.

With this configuration, the engine/transmission control LSI 3303 and the navigation LSI 3305 can execute communication between circuitry external to the LSI and a functional block in the LSI at high speed.

A reference character 3306a indicates an accelerator. A reference character 3306b indicates a brake. A reference character 3306c indicates a gear shifter. A reference character 3307 indicates an interface section. A reference character 3308 indicates an external input/output interface section. A reference character 3309 indicates a functional section including a TV antenna, a radio antenna, a GPS antenna, a display, a memory card, an infrared, a button, an audio output, and a parking brake. A reference character 3310 indicates a memory. A reference character 3311 indicates another LSI circuit. A reference character 3312 indicates an engine. A reference character 3313 indicates a transmission. A reference character 3314 indicates a memory. A reference character 3315 indicates another LSI.

Note that FIG. 20 shows an example relationship between the present disclosure, and the electronic control device and the mobile object including the electronic control device, and the functions of the car 3301, the electronic control device 3302, and the navigation device 3304 are not limited to this. A function may be added and the configuration may be changed unless a problem arises with the system. A function included in each LSI circuit may be arbitrarily changed if the function can be integrated into the LSI circuit.

The electronic control device including a semiconductor integrated circuit according to the present disclosure is not limited to the device which controls an engine, a transmission, etc. In addition to this, the electronic control device may be, for example, a general device which includes a semiconductor integrated circuit and controls a power source, such as a motor control device etc. According to the present disclosure, communication can be executed between circuitry external to the LSI and a functional block in the LSI at high speed for such electronic control devices.

The mobile object including a semiconductor integrated circuit according to the present disclosure is not limited to a car. In addition, the mobile object may be, for example, a general device including an electronic control device which controls a power source (e.g., an engine, a motor, etc.), such as a train, an airplane, etc. According to the present disclosure, communication can be executed between circuitry external to the LSI and a functional block in the LSI at high speed for such mobile objects.

As described above, the semiconductor integrated circuit of the present disclosure can provide a high transfer rate and a low latency even in the microfabrication process. Therefore, the present disclosure is useful for a semiconductor integrated circuit which transmits a data signal from the core of a sender to the core of a receiver at a high transfer rate, etc.

What is claimed is:

1. A semiconductor integrated circuit for transmitting and receiving a plurality of data signals in a source-synchronous scheme using an internal bus, comprising:
    a memory interface block;
    at least one read data adjustment circuit;
    at least one functional block;
    at least one write data adjustment circuit; and
    at least one selector circuit,
    wherein read data is transmitted from the memory interface block to the read data adjustment circuit serially connected thereto, and is transferred from each of the read data adjustment circuits to the corresponding functional block,
    write data is transferred from the plurality of functional blocks to the write data adjustment circuit, and is transmitted from the write data adjustment circuit serially connected thereto to the memory interface block, and
    the selector circuit selects either a clock signal from the functional block or a clock signal arranged side by side with a data signal from the write data adjustment circuit, the selected clock signal being output to the memory interface block or the write data adjustment circuit in a succeeding stage.

2. The semiconductor integrated circuit of claim 1, wherein the read data adjustment circuit and the write data adjustment circuit each include:
    a pulse generator circuit configured to generate a pulsed control signal based on the clock signal transmitted from the memory interface block, the functional block, or the adjustment circuit in a preceding stage, and
    a plurality of tri-state circuits configured to receive the plurality of data signals transmitted from the memory interface block, the functional block, or the adjustment circuit in the preceding stage, and be switched based on the control signal to output the plurality of data signals to the memory interface block, the functional block, or the adjustment circuit in a succeeding stage.

3. The semiconductor integrated circuit of claim 1, wherein the read data adjustment circuit and the write data adjustment circuit each include:
- a pulse generator circuit configured to generate a pulsed control signal based on the clock signal transmitted from the memory interface block, the functional block, or the adjustment circuit in a preceding stage, and a pulse width adjustment signal, and
- a plurality of tri-state circuits configured to receive the plurality of data signals transmitted from the memory interface block, the functional block, or the adjustment circuit in the preceding stage, and be switched based on the control signal to output the plurality of data signals to the memory interface block, the functional block, or the adjustment circuit in a succeeding stage.

4. The semiconductor integrated circuit of claim 1, wherein the read data adjustment circuit and the write data adjustment circuit are provided in or adjacent to the functional block.

5. A communication device comprising:
the semiconductor integrated circuit of claim 1;
a high-frequency transmission/reception interface section; and
an external input/output interface section,
wherein the semiconductor integrated circuit transmits or receives a signal to or from at least one of the high-frequency transmission/reception interface section and the external input/output interface section.

6. An information reproduction device comprising:
the semiconductor integrated circuit of claim 1;
a tuner section; and
an external input/output interface section,
wherein the semiconductor integrated circuit transmits or receives a signal to or from at least one of the tuner section and the external input/output interface section.

7. An image display device comprising:
the semiconductor integrated circuit of claim 1;
a network interface section; and
an external input/output interface section,
wherein the semiconductor integrated circuit transmits or receives a signal to or from at least one of the network interface section and the external input/output interface section.

8. An electronic device comprising:
the semiconductor integrated circuit of claim 1;
a CCD interface section; and
an external input/output interface section,
wherein the semiconductor integrated circuit transmits or receives a signal to or from at least one of the CCD interface section and the external input/output interface section.

9. An electronic control device comprising:
the semiconductor integrated circuit of claim 1; and
an external input/output interface section,
wherein the semiconductor integrated circuit transmits or receives a signal to or from the external input/output interface section.

10. A mobile object comprising:
the electronic control device of claim 9.

* * * * *